(12) United States Patent
Matsuura et al.

(10) Patent No.: US 7,496,151 B2
(45) Date of Patent: Feb. 24, 2009

(54) TRANSMITTING CIRCUIT, COMMUNICATION EQUIPMENT, AUDIO EQUIPMENT, VIDEO EQUIPMENT, AND TRANSMITTING METHOD

(75) Inventors: Toru Matsuura, Osaka (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 737 days.

(21) Appl. No.: 11/072,216

(22) Filed: Mar. 4, 2005

(65) Prior Publication Data

US 2005/0195918 A1 Sep. 8, 2005

(30) Foreign Application Priority Data

Mar. 5, 2004 (JP) ............................. 2004-062905

(51) Int. Cl.
*H04L 27/00* (2006.01)
(52) U.S. Cl. ...................... 375/295; 327/291; 332/106; 341/20
(58) Field of Classification Search ................. 375/295; 327/291; 332/106; 341/20
See application file for complete search history.

(56) References Cited

U.S. PATENT DOCUMENTS

| | | | | |
|---|---|---|---|---|
| 5,907,264 | A | * 5/1999 | Feldman | ..................... 332/103 |
| 6,784,817 | B2 | 8/2004 | Matsuura et al. | |
| 2002/0186440 | A1* | 12/2002 | Adachi et al. | ............... 359/181 |
| 2004/0037369 | A1 | 2/2004 | Matsuura et al. | |

FOREIGN PATENT DOCUMENTS

| CN | 2506026 Y | 8/2002 |
|---|---|---|
| JP | 2002-325109 A | 11/2002 |
| JP | 2004-072734 A | 3/2004 |

OTHER PUBLICATIONS

Ivanov, "Real time" noise measurements with sensitivity exceeding the standard thermal noise limit, Ultrasonics, IEEE Transactions on Ferroelectrics and Frequency Control, vol. 49, Issue 8, Aug. 2002 pp. 1160-1165.*

Xuejun, "Analysis of power recycling techniques for RF and microwave outphasing power amplifiers" IEEE Transactions on Circuits and Systems II: Analog and Digital Signal Processing, vol. 49, Issue 5, May 2002 pp. 312-320.*

Langridge, et al., "A Power Re-Use Technique for Improved Efficiency of Outphasing Microwave Power Amplifiers", IEEE Transactions on Microwave Theory and Techniques, vol. 47, No. 8, Aug. 1999.

* cited by examiner

*Primary Examiner*—Juan A Torres
(74) *Attorney, Agent, or Firm*—RatnerPrestia

(57) ABSTRACT

Data from the orthogonal data generator is quantized by the vector data converter to become, for example, a binary value of 0 and a real number in magnitude. The output of the vector converter is modulated by the modulator, and is inputted to the amplifier. In the amplifier, the envelope of the signal to be inputted is quantized. That is, the signal of a constant envelope becomes a signal which is turned ON and OFF, so that a highly efficient nonlinear amplifier can be used. The filter removes the quantization noise generated in the vector data converter and then the signal of a low distortion and a low noise is outputted from the output terminal. The isolation unit is connected between the amplifier and the filter, avoiding effects on the output impedance of the amplifier from the filter, so that a signal of a low distortion can be outputted.

19 Claims, 25 Drawing Sheets

TRANSMITTING CIRCUIT, COMMUNICATION EQUIPMENT, AUDIO EQUIPMENT, VIDEO EQUIPMENT, AND TRANSMITTING METHOD

BACKGROUND OF THE INVENTION

1. Field of the Invention

The present invention relates to a transmitting circuit, communication equipment, an audio equipment, a video equipment, and a transmitting method used in a radio apparatus such as a mobile phone, a wireless local area network (WLAN) and the like.

2. Related Art of the Invention

One example of a conventional transmitting circuit (for example, see Japanese Patent Laid-Open Publication No. 2002-325109) is shown in FIG. 27.

The conventional transmitting circuit consists of a data generator 1501, a delta sigma modulator 1502, a power source control unit 1503, an angle modulator 1504, an amplitude modulator 1505, a filter 1506, and an output terminal 1507.

The data generator 1501 is a circuit which outputs an amplitude data and a phase data.

The delta sigma modulator 1502 is a circuit, which delta-sigma-modulates an inputted data, and outputs a data lower in resolution than the inputted data, that is, a data lower in the number of the voltage value to be obtained.

The power source control unit 1503 is a circuit which outputs a voltage proportional to an input signal.

The angle modulator 1504 is a circuit which angle-modulates a carrier wave with a phase data.

The amplitude modulator 1505 is a circuit which amplitude-modulates an angle-modulated wave with a signal supplied from the power source control unit 1503.

The filter 1506 is a circuit which removes an unnecessary frequency component from among input signals.

The output terminal 1507 is a terminal for obtaining an output signal.

Next, the operation of the conventional transmitting circuit will be described.

The amplitude data and the phase data are outputted from the data generator 1501. The amplitude data outputted from the data generator 1501 is delta-sigma-modulated by the delta sigma modulator 1502, and is inputted to the power source control unit 1503. The power source control unit 1503 outputs a voltage proportional to the input signal. In the meantime, the phase data outputted from the data generator 1501 is angle-modulated by the angle modulator 1504, and is inputted to the amplitude modulator 1505. The amplitude modulator 1505 amplitude-modulates an angle-modulated wave with the signal supplied from the power source control unit 1503. A quantization noise generated by the delta sigma modulator 1502 is removed by the filter 1506, and is outputted from the output terminal 1507.

By using such a conventional transmitting circuit, it is expected that the effects of nonlinearity of an amplifier can be minimized, and an efficient circuit which needs little consumption power is provided.

SUMMARY OF THE INVENTION

However, the present inventor has found that, in the conventional transmitting circuit described in FIG. 27, an out of band impedance of the filter 1506 has effects on the characteristics of the amplitude modulator 1505. That is, the inventor has found that, in the transmitting circuit of FIG. 27, because of the out of band impedance of the filter 1506, a sufficient band width cannot be obtained in the amplitude modulator 1505, and the output signal ends up being distorted.

That is, there is a problem in that, because of the out of band impedance of the filter, the conventional transmitting circuit is unable to secure a sufficient band width in the amplitude modulator, and the output signal ends up being distorted.

Further, in the transmitting circuit of FIG. 27, since the delta sigma modulator 1502 is used, the quantization noise signal is distributed in a wide frequency range. Since such a quantization noise signal distributed in a wide frequency range is removed by the filter 1506, energy of the quantization noise is wasted, and the power consumption of the entire transmitting circuit cannot be reduced.

That is, in the conventional transmitting circuit, there is a problem in that energy of the quantization noise signal is wasted, and the power consumption of the entire transmitting circuit cannot be reduced.

In consideration of the above described problems, it is an object of the present invention to provide a transmitting circuit, a communication equipment, an audio equipment, a video equipment, and a transmitting method which can secure a sufficient band width and have little distortion of an output signal.

Further, in consideration of the above described problems, it is an object of the present invention to provide a transmitting circuit, a communication equipment, an audio equipment, a video equipment, and a transmitting method which can reduce the power consumption of the entire transmitting circuit and are highly efficient.

To solve the above described problems, the $1^{st}$ aspect of the present invention is a transmitting circuit, comprising a signal modulation conversion circuit, which receives an inputted signal and performs a predetermined modulation or a predetermined signal conversion, and outputs a signal lower in resolution than said inputted signal;

an amplifier of amplifying a signal outputted from said signal modulation conversion circuit;

an isolation unit, one terminal of which is connected to the output of said amplifier; and a filter, which is connected to the other terminal of said isolation unit, and reduces an unnecessary frequency component of the signals outputted from said amplifier;

wherein, in said isolation unit, magnitude of input reflection coefficient is smaller than magnitude of input reflection coefficient of said filter in a frequency band width from the frequency in which half the sampling frequency of said signal modulation conversion circuit is subtracted from the mean frequency of the signal outputted from said filter to the frequency in which half the sampling frequency of said signal modulation conversion circuit is added to the mean frequency of the signal outputted from said filter.

The $2^{nd}$ aspect of the present invention is the transmitting circuit according to the $1^{st}$ aspect of the present invention, comprising an orthogonal data generator of generating an orthogonal data, wherein said signal modulation conversion circuit comprises:

a vector data converter which is connected to the output of said orthogonal data generator of outputting a data smaller in resolution with respect to the magnitude expressed by a square root of the sum of squares of the orthogonal data; and a modulator connected to the output of said vector data converter;

wherein said amplifier is connected to the output of said modulator.

The $3^{rd}$ aspect of the present invention is the transmitting circuit according to the $1^{st}$ aspect of the present invention, comprising a polar data generator, which generates an amplitude data and a phase data, and outputs said amplitude data generated from a first output, and outputs said phase data generated from a second output, wherein said signal modulation conversion circuit comprises:

a scalar data converter which is connected to the output of said first output of said polar data generator of outputting a data lower in resolution than an input;

a power source control unit connected to the output of said scalar data converter; and an angle modulator connected to said second output of said polar data generator;

said amplifier serving as an amplitude modulator, wherein said amplitude modulator is connected to the output of said angle modulator and the output of said power source control unit, and the output is connected to said isolation unit.

The $4^{th}$ aspect of the present invention is the transmitting circuit according to the $1^{st}$ aspect of the present invention, comprising a signal generator of generating a signal, wherein said signal modulation conversion circuit has the scalar data converter which is connected to the output of said signal generator of outputting a data lower in resolution than an input, and wherein said amplifier is connected to the output of said scalar data converter.

The $5^{th}$ aspect of the present invention is the transmitting circuit according to any one of the $1^{st}$ to the $4^{th}$ aspects of the present invention, wherein said isolation unit is an isolator.

The $6^{th}$ aspect of the present invention is the transmitting circuit according to any one of the $1^{st}$ to the $4^{th}$ aspects of the present invention, wherein said isolation unit is an attenuator.

The $7^{th}$ aspect of the present invention is a transmitting circuit, comprising a signal modulation conversion circuit, which receives an inputted signal and performs a predetermined modulation or a predetermined signal conversion, and outputs a signal lower in resolution than said inputted signal;

an amplifier of amplifying a signal outputted from said signal modulation conversion circuit;

a power supply unit of supplying a power to said amplifier;

a circulator, which has a first terminal, a second terminal, and a third terminal, and outputs the signal inputted from said first terminal from said second terminal, and outputs the signal inputted from said second terminal from said third terminal, and outputs the signal inputted from said third terminal from said first terminal, and in which said first terminal is connected to the output of said amplifier;

a filter, which is connected to said second terminal of said circulator, and in which an unnecessary frequency component from among the signals outputted from said amplifier is attenuated;

a power recycle unit, in which an input is connected to said third terminal of said circulator, and the output is connected to the output of said power supply unit, and an inputted signal is converted into a direct current signal and is outputted.

The $8^{th}$ aspect of the present invention is the transmitting circuit according to the $7^{th}$ aspect of the present invention, comprising an orthogonal data generator of generating an orthogonal data, wherein said signal modulation conversion circuit comprises:

a vector data converter which is connected to the output of said orthogonal data generator of outputting a data smaller in resolution with respect to the magnitude expressed by a square root of the sum of squares of the orthogonal data; and a modulator connected to the output of said vector data converter;

wherein said amplifier is connected to the output of said modulator.

The $9^{th}$ aspect of the present invention is the transmitting circuit according to the $7^{th}$ aspect of the present invention, comprising a polar data generator, which generates an amplitude data and a phase data, and outputs said amplitude data generated from the first output, and outputs said phase data generated from the second output, wherein said signal modulation conversion circuit comprises:

a scalar data converter which is connected to the first output of said polar data generator of outputting a data lower in resolution than an input; and an angle modulator connected to second output of said polar data generator, wherein said power supply unit is a power source control unit connected the output of said scalar data converter, wherein said amplifier serves as an amplitude modulator, wherein said amplitude modulator is connected to the output of said angle modulator and the output of said power source control unit.

The $10^{th}$ aspect of the present invention is the transmitting circuit according to the $7^{th}$ aspect of the present invention, comprising a signal generator of generating a signal, wherein said signal modulation conversion circuit has a scalar data converter which is connected to the output of said signal generator of outputting a data lower in resolution than an input, wherein said amplifier is connected to the output of said scalar data converter.

The $11^{th}$ aspect of the present invention is the transmitting circuit according to the $2^{nd}$ or the $8^{th}$ aspect of the present invention, wherein said vector data converter comprises:

an original data generating unit of generating a in-phase signal I and quadrature-phase signal Q and an amplitude component of the orthogonal signal composed of said signal I and signal Q from the inputted signal;

a delta sigma modulator of converting said amplitude component into a signal having a resolution smaller than the resolution of said amplitude component;

a first multiplying unit of outputting a first data obtained by multiplying a normalized data I in which said signal I is divided by said amplitude component by said converted signal; and a second multiplying unit of outputting a second data obtained by multiplying a normalized data Q in which said signal Q is divided by said amplitude component by said converted signal.

The $12^{th}$ aspect of the present invention is the transmitting circuit according to the $2^{nd}$ or the $8^{th}$ aspect of the present invention, wherein said vector data converter comprises:

an orthogonal input terminal, to which the orthogonal data having the signal I and the signal Q is inputted;

an operation circuit connected to said orthogonal data input terminal;

a first vector quantizer connected to the output side of said operation circuit; and an output terminal connected to the output side of said first vector quantizer;

said signal I and said signal Q forming a predetermined vector, wherein said operation circuit is a circuit, in which a unit circuit comprising: a first vector subtractor having a first terminal and a second terminal; and a vector integrator connected to the output side of said first vector subtractor is connected in n (n is a natural number) pieces, wherein the output of said output terminal and/or the output of said each vector integrator is inputted to said second input terminal of the first vector subtractor of said each unit circuit;

wherein said orthogonal data input terminal is connected to said first input terminal of said first vector subtractor of said first unit circuit;

wherein each of said unit circuit is mutually connected by the output terminal of said vector integrator and said first input terminal of said first vector subtractor;

wherein said first vector subtractor outputs an orthogonal data in which a vector made by the orthogonal data inputted to said second input terminal is subtracted from a vector made by orthogonal data inputted from said first input terminal;

wherein said vector integrator integrates a vector composed of said inputted orthogonal data; and wherein said first vector quantizer outputs a quantization predetermined value with respect to at least the magnitude of an inputted vector.

The $13^{th}$ aspect of the present invention is the transmitting circuit according to any one of the $3^{rd}$, the $4^{th}$, the $9^{th}$ and the $10^{th}$ aspects of the present invention, wherein said scalar data converter is a delta sigma modulation circuit.

The $14^{th}$ aspect of the present invention is the transmitting circuit according to any one of the $8^{th}$ to the $10^{th}$ aspects of the present invention, wherein said power recycle unit comprises:
a diode;
a bias circuit of supplying a bias voltage to said diode; and
a capacitor, which is connected in parallel to the output of said diode, and the other of which is grounded.

The $15^{th}$ aspect of the present invention is the transmitting circuit according to any one of the $8^{th}$ to the $10^{th}$ aspects of the present invention, wherein said power recycle unit comprises:
a balun;
a pair of diodes connected to two outputs of said balun, respectively;
a pair of bias circuits for supplying a bias voltage to said pair of diodes, respectively; and
a pair of capacitors, which are connected in parallel to each output of said pair of diodes, and the other of which are grounded.

The $16^{th}$ aspect of the present invention is a communication equipment, comprising:
a duplexer connected to an antenna;
a transmitting circuit of outputting a transmitting signal to said duplexer; and
a receiving circuit of receiving an inputted received signal from said duplexer;
wherein, for said transmitting circuit, the transmitting circuit according to any one of the $1^{st}$ to the $4^{th}$, and $7^{th}$ to the $10^{th}$ aspects of the present invention is used.

The $17^{th}$ aspect of the present invention is an audio equipment, comprising:
a transmitting circuit of outputting an audio signal; and
an audio output unit of outputting said audio signal outputted from said transmitting circuit as a sound;
wherein, for said transmitting circuit, the transmitting circuit according to the $4^{th}$ or the $10^{th}$ aspect of the present invention is used.

The $18^{th}$ aspect of the present invention is a video equipment, comprising:
a transmitting circuit of outputting a video signal; and
a display unit of displaying said video signal outputted from said transmitting circuit;
wherein, for said transmitting circuit, the transmitting circuit according to the $4^{th}$ or the $10^{th}$ aspect of the present invention is used.

The $19^{th}$ aspect of the present invention is a transmitting method, comprising the steps of:
a signal modulation conversion step, which receives an inputted signal and performs a predetermined modulation or a predetermined signal conversion, and outputs a signal lower in resolution than said inputted signal;
an amplifying step of amplifying a signal processed by said signal modulation conversion step;
an isolation step of passing a signal processed by said amplifying step; and
a filter step of reducing an unnecessary frequency component of the signals processed by said amplifying step;
wherein in said isolation step, magnitude of input reflection coefficient is smaller than magnitude of input reflection coefficient of said filter step in a frequency band width from the frequency in which half the sampling frequency of said signal modulation conversion step is subtracted from the mean frequency of the signal processed by said filter step to the frequency in which half the sampling frequency of said signal modulation conversion step is added to the mean frequency of the signal processed by said filter step.

The present invention can provide a transmitting circuit, a communication equipment, an audio equipment, a video equipment, and a transmitting method which can secure a sufficient band width and have little distortion of an output signal.

Further, the present invention can provide a transmitting circuit, a communication equipment, an audio equipment, a video equipment, and a transmitting method which can reduce the power consumption of the entire transmitting circuit and are highly efficient.

Figure 1:
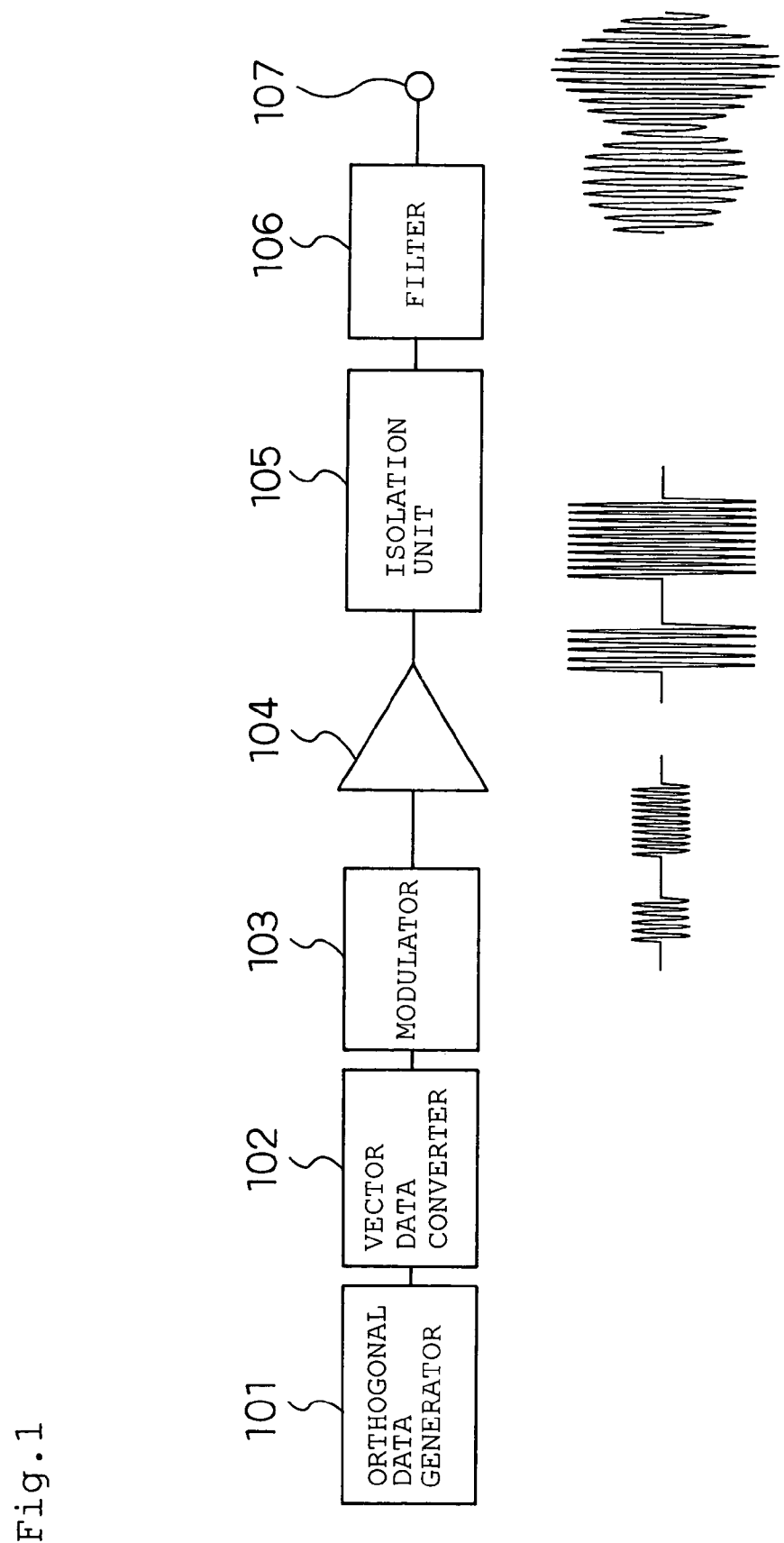
FIG. 1 is a block diagram showing a configuration example of a transmitting circuit according to a first embodiment of the present invention.

DESCRIPTION OF REFERENCE NUMERALS 101 orthogonal data generator
102 vector data converter
103 modulator
104 amplifier
105 isolation unit
106 filter
107 output terminal
301 orthogonal data generator
302 vector data converter
303 coordination system conversion unit
304 power source control unit
305 angle modulator
306 amplitude modulator
307 isolation unit
308 filter
309 output terminal
401 polar data generator
402 scalar data converter
403 power source control unit
404 angle modulator
405 amplitude modulator
406 isolation unit
407 filter
408 output terminal
501 signal generator
502 scalar data converter
503 amplifier
504 isolation unit
505 filter
506 output terminal
601, 602 input terminal
603, 604 output terminal
605 coordination system conversion unit
606 delta sigma modulator
607, 608 multiplier
701 input terminal
702 output terminal
703 subtractor
704 vector integrator
705 vector quantizer
801 input terminal
802 output terminal
803 subtractor
804 integrator
805 quantizer
1001 orthogonal data generator
1002 vector data converter
1003 modulator
1004 amplifier
1005 circulator
1006 power recycle unit
1007 power supply unit
1008 filter
1009 output terminal
1101 polar data generator
1102 angle modulator
1103 amplitude modulator
1104 scalar data converter
1105 power source control unit
1106 circulator
1107 power recycle unit
1108 power supply unit
1109 filter
1110 output terminal
1201 signal generator
1202 scalar data converter
1203 amplitude modulator
1204 circulator
1205 power recycle unit
1206 power supply unit
1207 filter
1208 output terminal
1301 input terminal
1302 output terminal
1303 bias circuit
1304 diode
1305 capacitor
1401 input terminal
1402, 1403 output terminal 1404, 1405 bias circuit
1406, 1407 diode
1408, 1409 capacitor
1501 data generator
1502 delta sigma modulator
1503 power source control unit
1504 angle modulator
1505 amplitude modulator
1506 filter
1507 output terminal

PREFERRED EMBODIMENTS OF THE INVENTION

Embodiments of the present invention will be described below with reference to the drawings.

First Embodiment

A first embodiment of the present invention will be described by using FIG. 1.

A transmitting circuit shown in FIG. 1 comprises an orthogonal data generator 101, a vector delta modulator 102, a modulator 103, an amplifier 104, an isolation unit 105, a filter 106, and an output terminal 107.

The orthogonal data generator 101 is a circuit, which generates a signal I and a signal Q which are an orthogonal data (baseband data).

The vector data converter 102 is a circuit which converts the signal I and the signal Q, and quantizises them with respect to the magnitude of the vector.

The modulator 103 is a circuit which modulates an inputted signal.

The amplifier 104 is a circuit which amplifies an inputted signal.

The isolation unit 105 is a circuit which prevents the output impedance of the amplifier 104 from being affected by the filter 106.

The filter 106 is a circuit which removes the quantization noise generated in the vector data converter 102.

The output terminal 107 is a terminal for obtaining an output signal.

The vector data converter 102 and the modulator 103 in the present first embodiment are an example of the signal modulation conversion circuit of the present invention.

Next, the operation of the present embodiment will be described.

In the orthogonal data generator 101, the signal I and the signal Q, which are the orthogonal data (baseband data), are generated.

The signal I and the signal Q generated in the orthogonal data generator 101 are data-converted by the vector data converter 102, and are quanitized with respect to magnitude of the vector. For example, the magnitude of the vector is quantized so as to become two values, zero and the real number. The output of the vector data converter 102 is modulated by the modulator 103, and is inputted to the amplifier 104.

In the amplifier 104, an envelope of the signal to be inputted is quantized. That is, since a signal of a constant envelope has become a signal turned ON and OFF, a highly efficient non-linear amplifier can be used.

Hereinafter, an availability of a highly efficient non-linear amplifier will be described as the amplifier 104.

That is, though the amplifier 104 outputs a signal of the level corresponding to the value of the modulator 103, the output signal from the modulator 103 has the small number of signal levels to be obtained since, for example, the signal of the envelope is qunatizied so as to become a signal turned ON and OFF. Consequently, the amplifier 104 may output only several types of output levels proportional to the signal level corresponding to the number of signal levels having the small number of input signals. Hence, even when the amplifier 104 low in linearity is used, the correction of the output level can be easily performed.

Particularly, when the vector data converter 102 is configured to output one bit regarding the magnitude of the vector, that is, a possible value of the signal level is binary, the amplifier 104 may simply operate as a switch, and can be used in a near-saturated state, thereby achieving high efficiency. Further, there are a few elements which depend on analogue characteristics, and even with an element having a large distortion, characteristics of a fine linearity can be obtained.

In general, when the signal level of the input signal continuously changes, and an analogue signal which can obtain a great many number of signal levels is amplified, in case the amplifier 104 has non-linear input and output characteristics, to correct the non-linearity of the input and output characteristics of the amplifier 104, it is conceivable that the input signal may be subjected to a processing in advance by anticipating the non-linearity of the input and output characteristics of the amplifier 104. However, to subject the input signal to the processing in advance so that the input and output characteristics of the amplifier 104 are corrected, it is necessary to consider the input and output characteristics of the amplifier 104 in the whole portion of a great many number of signal levels obtainable by the input signal. However, in order to subject the input signal to the processing in advance by anticipating the non-linearity of the input and output characteristics of the amplifier 104 in the whole portion of a great many number of signal levels obtainable by the input signal, a large capacity of memory is required, and temperature dependency must be considered. Therefore, it is difficult to realize such a thing.

In contrast to this, in the case of the signal lower in resolution than the inputted signal in which a signal level of the input signal changes stepwise, even when the input and output characteristics of the amplifier 104 are non-linear, by adjusting the value only which can be taken by the input signal stepwise, the output signal which is not distorted can be outputted. In this way, in case the input level of the input signal is a signal lower in resolution than the inputted signal, which takes a step like value, even when the input and output characteristics of the amplifier 104 are non-linear, by allowing a signal to be inputted to the amplifier 104 at a level of magnitude in consideration of the non-linearity, a desired output signal which is not distorted can be obtained from the amplifier 104.

Further, since the amplifier 104 is only to amplify the angle modulated signal which is a sine wave at each step-like signal level, it basically does not generate a distortion other than a higher harmonic wave. Hence, in the signal of each step, in case the angle modulated signal is amplified by the amplifier 104, even if the amplifier 104 has non linear characteristics, there occurs no distortion other than the higher harmonic wave. Hence, even when the amplifier 104 is used under operating conditions close to saturation, a distortion generated close to the transmitting output is small. Further, there is almost no current let flow at an OFF time. Hence, a high efficiency can be achieved.

Thus, as the amplifier 104, the availability of a high efficient non-linear amplifier has been described.

Now, the output signal from the amplifier 104 is inputted to the filter 106 through the isolation unit 105. In the filter 106, the quantization noise generated in the vector data converter 102 is removed, and after that, the signal of a low distortion and a low noise is outputted from the output terminal 107. However, though the high efficient non-linear amplifier can be used as the amplifier 104 as described above, since the signal outputted from the vector data converter 102 is a wide bandwidth, a gain of the amplifier 104 should not be allowed to change sharply within the frequency range of a mean frequency ±fs/2 (fs is a sampling frequency of the data converter) in order to avoid a distortion in the amplifier 104. However, the present inventor has found, as described in the [problems to be solved by the invention] of the specification of present application, that, when the filter 106 is directly connected to the output of the amplifier 104, the out of band impedance of the filter 106 has effects on the characteristics of the amplifier 104. That is, the present inventor has found that, because of the effects of the out of band impedance of the filter 106, a sufficient bandwidth cannot be secured by the amplifier 104, and the output signal from the amplifier 104 is distorted.

Figure 2:
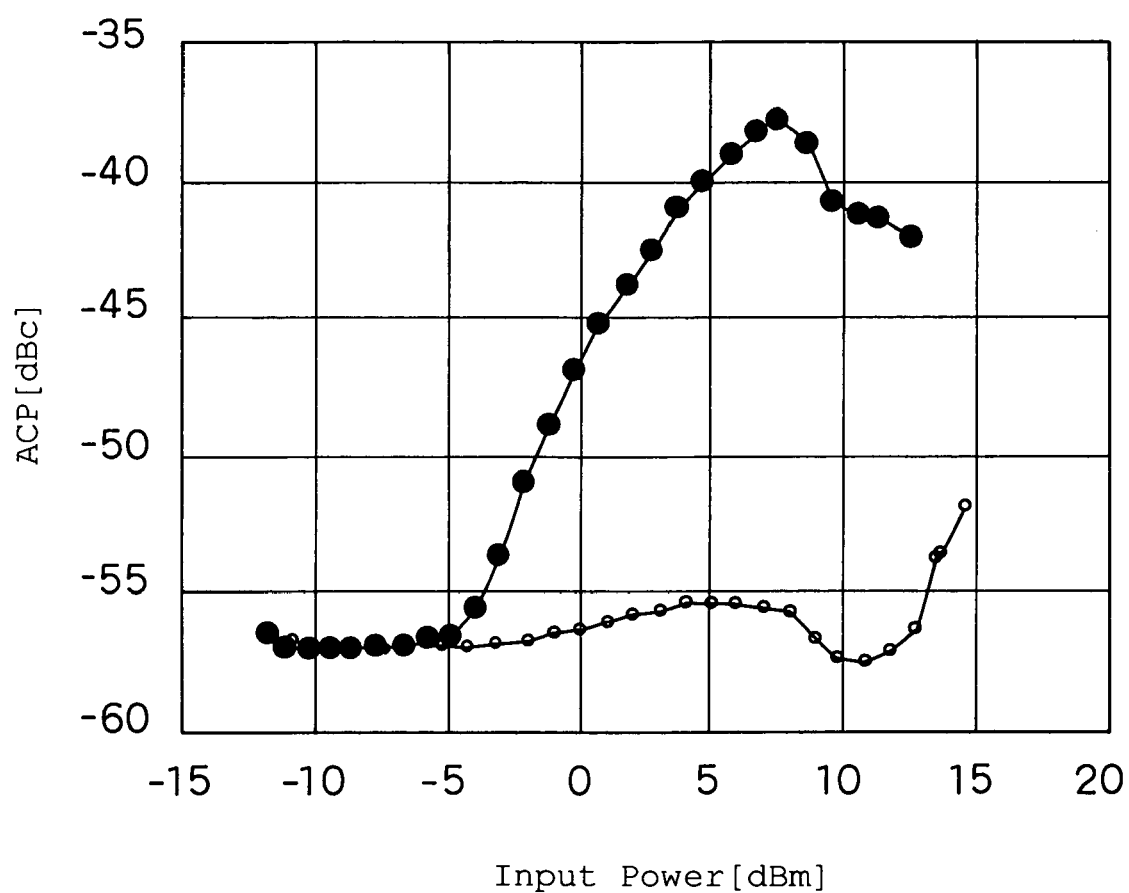
FIG. 2 is a view showing a measuring result of the adjacent-channel leakage power of the transmitting circuit according to the first embodiment of the present invention and the adjacent-channel leakage power of the configuration in which a filter is directly connected to an amplifier.

That is, FIG. 2 shows a result of measuring an adjacent-channel leakage power of the transmitting circuit of the first embodiment, and an adjacent-channel leakage power of the transmitting circuit in case the filter 106 is directly connected to the amplifier 104 without using the isolation unit 105 in the transmitting circuit of the present first embodiment.

FIG. 2 show a result of measuring the adjacent-channel leakage power at 50 kHz detuning and 21 kHz integral bandwidth by inputting PDC signal. In FIG. 2, an axis of abscissas shows an input power (dBm), and an axis of ordinate shows an adjacent-channel leakage power (ACP: Adjacent Channel Power). Further, a curve depicted and overlaid with outlined round marks shows the adjacent-channel leakage power of the transmitting circuit of the present first embodiment, and a curve depicted and overlaid with filled round marks shows the adjacent-channel leakage power of the transmitting circuit in case the filter 106 is directly connected to the amplifier 104 without using the isolation unit 105. As evident from FIG. 2, when the input signal of the amplifier 104 is equal to or more than −5 dBm, comparing to the adjacent-channel leakage power of the transmitting circuit of the present first embodiment, the adjacent-channel leakage power of the transmitting circuit in case the filter 106 is directly connected to the amplifier 104 without using the isolation unit 105 in the transmitting circuit of the present first embodiment is apparently larger. As evident from the measuring result in FIG. 2, in the transmitting circuit of the present first embodiment, in case the isolation unit 105 is not used, but the filter 106 is directly connected to the amplifier 104, the output signal from the amplifier 104 is distorted.

In other words, the filter 106 is large in coefficient of reflection in a suppressed bandwidth, and if connected as it is, evenness of a gain cannot be secured in the amplifier 104, and the output signal from the amplifier 104 ends up being distorted.

Figure 3:
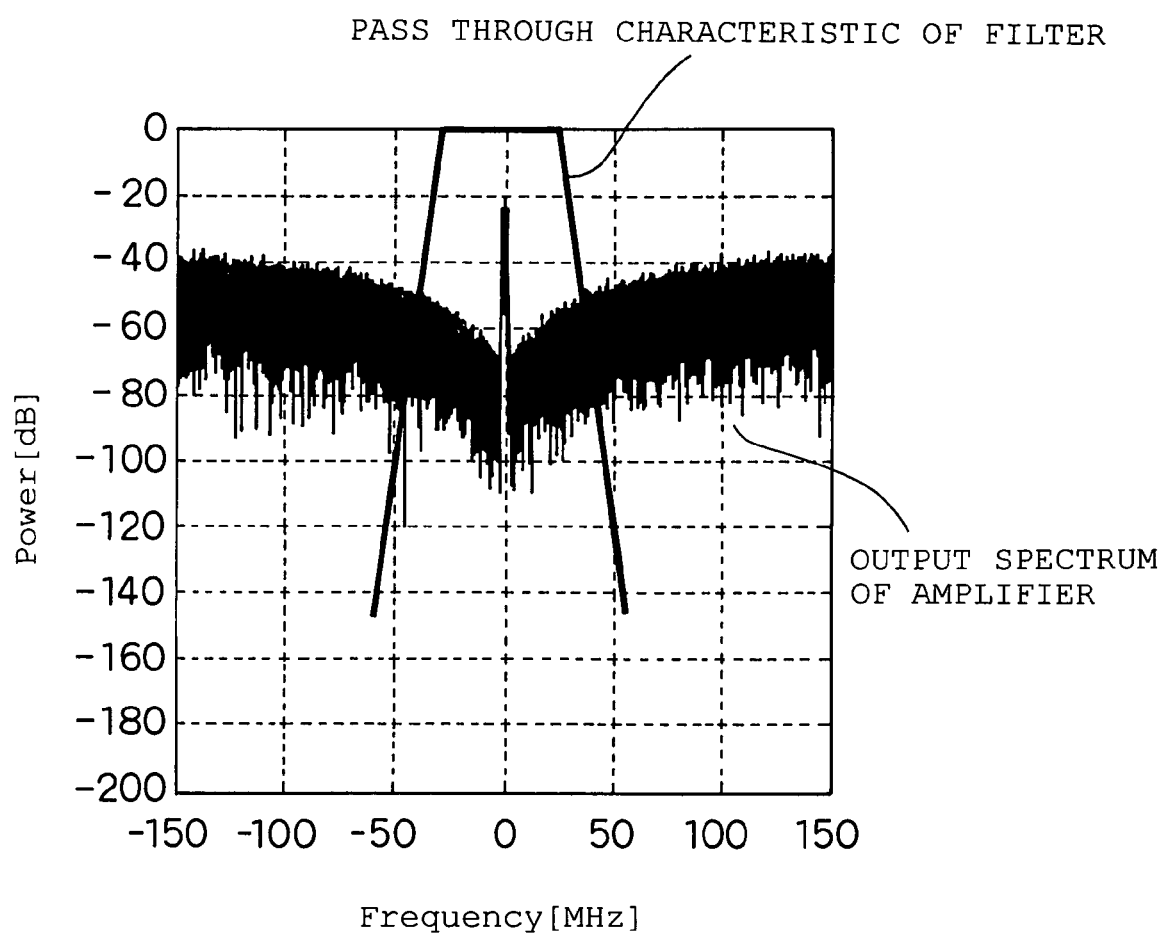
FIG. 3 is a block diagram showing a configuration example of the transmitting circuit according to the first embodiment of the present invention.

Hence, the isolation unit 105 is connected between the amplifier 104 and the filter 106, so that the output impedance of the amplifier 104 is not affected by the filter 106. As the isolation unit 105, an isolation unit having an input coefficient of reflection smaller than the input coefficient of reflection of the filter 106 within the frequency range of a mean frequency ±fs/2 (fs is a sampling frequency of the data converter) of the filter 106 is used. As a result, a signal of a low distortion can be outputted. One example of an output spectrum of the amplifier 104 and a pass-through characteristic of the filter 106 are shown in FIG. 3.

Next, a specific configuration of the vector data converter 102 will be described.

Figure 13:
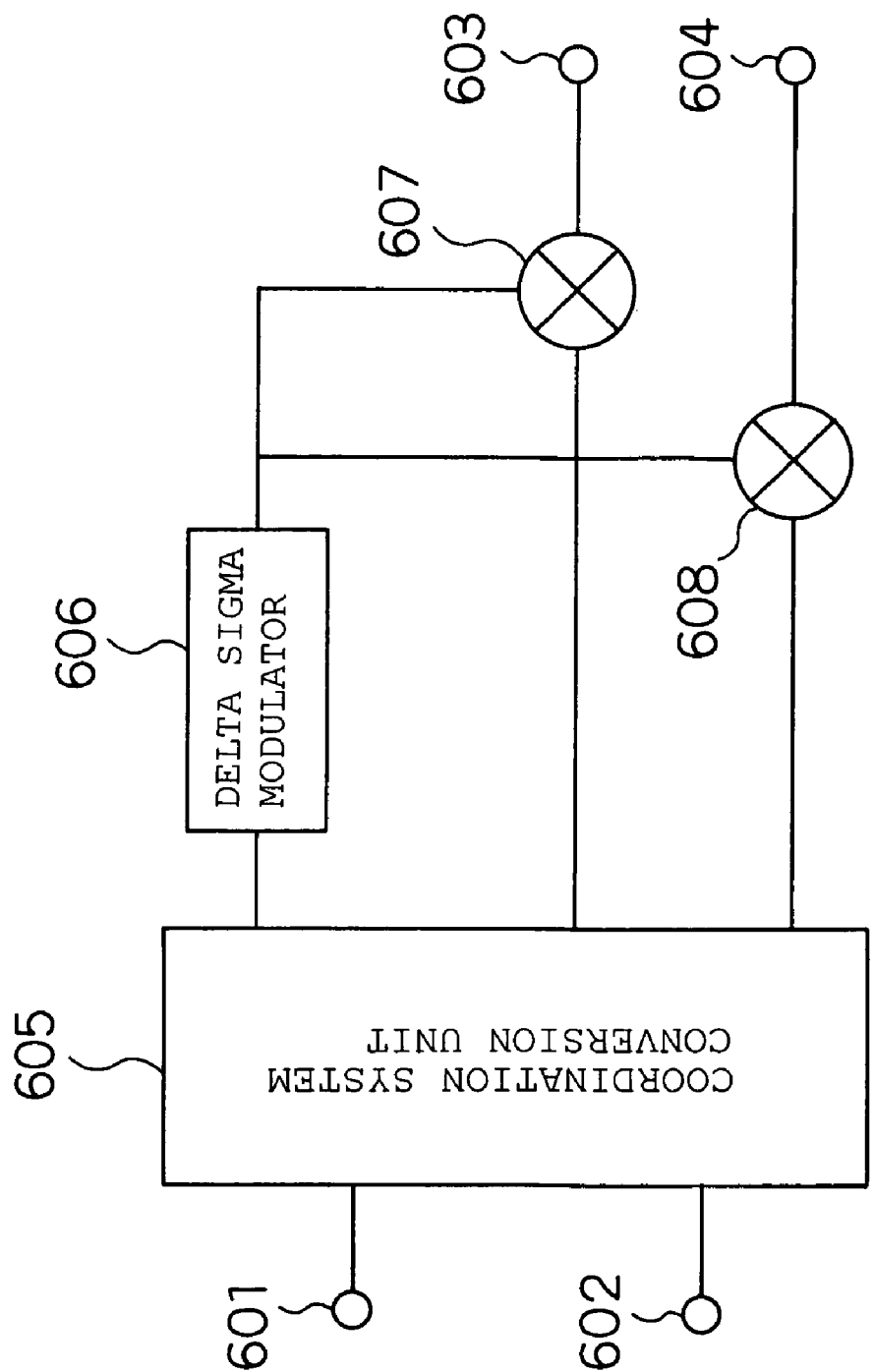
FIG. 13 is a block diagram showing a configuration example of a vector data converter using a delta sigma modulator.

In FIG. 13, the configuration of the vector data converter 102 using a delta sigma modulator 606 is shown. In FIG. 13, the vector data converter 102 comprises input terminals 601 and 602, a coordinate system conversion unit 605, a delta sigma modulator 606, multipliers 607 and 608, and output terminals 603 and 604.

The input terminals 601 and 602 are terminals, which receive the inputted signal I and signal Q, which are orthogonal signals, respectively, from the orthogonal data generator 101.

The coordinate system conversion unit 605 is a circuit, which generates amplitude signals $(I^2+Q^2)^{1/2}$ of the orthogonal signals inputted from the input terminals 601 and 602, and outputs a normalized I data $(I/(I^2+Q^2)^{1/2})$ and a normalized Q data $(Q/(I^2+Q^2)^{1/2})$.

The output side of the normalized signal I is connected to one end of the input side of the multiplier 607, and the output side of the normalized signal Q is connected to one end of the input side of the multiplier 608.

Further, the output side of the amplitude signal of the coordinate system conversion unit 605 is connected to the delta sigma modulator 606. Further, the output side of the delta sigma modulator 606 is connected to the other end of each input side of the multipliers 607 and 608. The output sides of the multipliers 607 and 608 are connected to the output terminals 603 and 604, respectively.

Next, the operation of the vector data converter 102 will be described.

The signal I and the signal Q which are the orthogonal signal outputted from the orthogonal data generator 101 are inputted to the coordinate system conversion unit 605 from the input terminals 601 and 602, respectively.

The coordinate system conversion unit 605 generates the amplitude signal $(I^2+Q^2)^{1/2}$ of the orthogonal signal inputted from the input terminals 601 and 602, and outputs the normalized I data $(I/(I^2+Q^2)^{1/2})$ and the normalized Q data $(Q/(I^2+Q^2)^{1/2})$.

In the multiplier 607, the normalized data I inputted to the multiplier 607 is multiplied by the signal delta-sigma-modulated (±a) which is inputted from the other input side of the multiplier 607, and a first data $(\pm a\ I/(I^2+Q^2)^{1/2})$ is obtained. The obtained first data is outputted from the multiplier 607 through the output terminal 603.

Further, in the multiplier 608, the normalized data Q inputted to the multiplier 608 is multiplied by the signal delta-sigma-modulated (±a), which is inputted from the other input side of the multiplier 608, and a second data $(\pm a\ Q/(I^2+Q^2)^{1/2})$ is obtained. The obtained second data is outputted from the multiplier 608 through the output terminal 604.

When the first data and the second data thus obtained are orthogonal-modulated, a signal of constant envelope is obtained. That is, the amplitude component of the orthogonal signal composed of the first data and the second data becomes a, and takes a constant value. This means that the envelope of the orthogonal signal composed of the first data and the second data is a constant value.

Although a description has been made that the signal, which is delta-sigma-modulated as described above, takes a binary value of +a and −a, it can be considered to be a binary value which takes zero and a real number other than zero. The signal composed of the first data and the second data in that case becomes a signal in which a constant envelope signal is turned ON and OFF.

Since, by using the vector data converter 102, linearity is not required in the amplifier 104 of a subsequent stage as described above, a transmitting circuit which consumes less power and is highly efficient can be realized.

Figure 14:
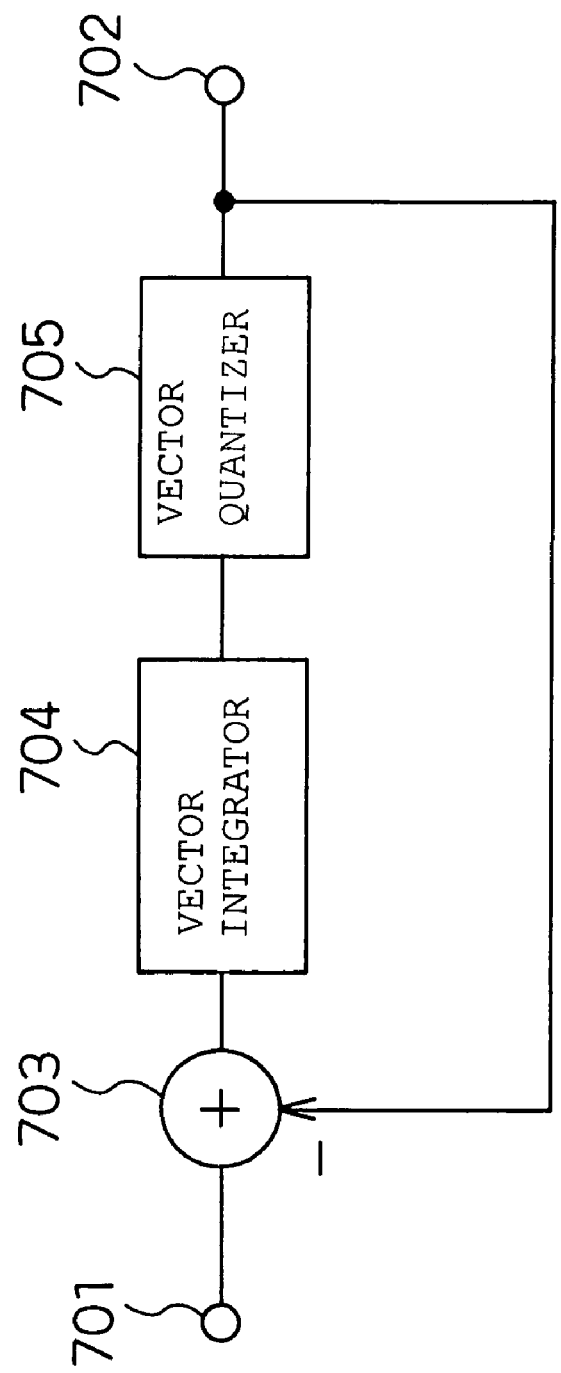
FIG. 14 is a block diagram showing a configuration example of the vector data converter using a vector quantizer.

In FIG. 14 is shown a configuration of the vector data converter 102 using a vector quantizer. The vector data converter 102 shown in FIG. 14 comprises an input terminal 701, a subtractor 703, a vector integrator 704, a vector quantizer 705, and output terminal 702.

The input terminal 701 is connected to one end of the input side of the subtractor 703. Further, the output side of the subtractor 703 is connected to the vector integrator 704, and the output of the vector integrator 704 is connected to the vector quantizer 705, and its output is connected to the output terminal 702. Further, the output of the vector quantizer 705 is inputted from the other input side of the subtractor 703.

Next, the operation of the vector data converter 102 will be described. The input terminal 701 is inputted with the orthogonal data signals I and Q. The signal I and the signal Q are inputted to the vector integrator 704 through the vector subtractor 703. In the vector integrator 704, the vector made by the signal I and the signal Q is integrated by a vector operation. This integration result is inputted to the vector quantizer 705.

First, the case where the vector qunatized device 705 quantizes a magnitude of vector will be described. Assuming that 0<a (a is a real number), depending on the magnitude of the input vector to the vector quantizer 705, a vector having a magnitude of a or 0 is outputted. As a method of quantization, for example, when the magnitude of the input vector is smaller than a, which is a threshold value, the magnitude of the output vector is taken as 0, and when the magnitude of the input vector is not smaller than a, the magnitude of the output vector is taken as a. This output is outputted from the output terminal 702, and at the same time, it is subjected to a subtraction treatment at the vector subtractor 703. In the vector subtractor, to be more specific, an operation is performed, in which the vector outputted from the vector quantizer 705 is subtracted from the vector inputted from the input terminal 701 by the vector operation.

Since the signal I' and the signal Q' which convert the signal I and the signal Q as described above are either a or 0 in magnitude of the vector, the output of the vector data converter 102 becomes the signal of the constant envelope switched ON and OFF.

Consequently, since, by using the above described vector data converter 102, linearity is not required in the amplifier 104 of the subsequent stage, it can operate close to a saturation point of amplifying characteristics, thereby realizing a highly efficient transmitting circuit.

As the vector data converter 102, though a description has been made that the vector data converter 102 is used by using the vector quntized device shown in FIG. 14, it is not limited to this. As the vector data converter 102, a higher order configuration can be used also.

Figure 15:
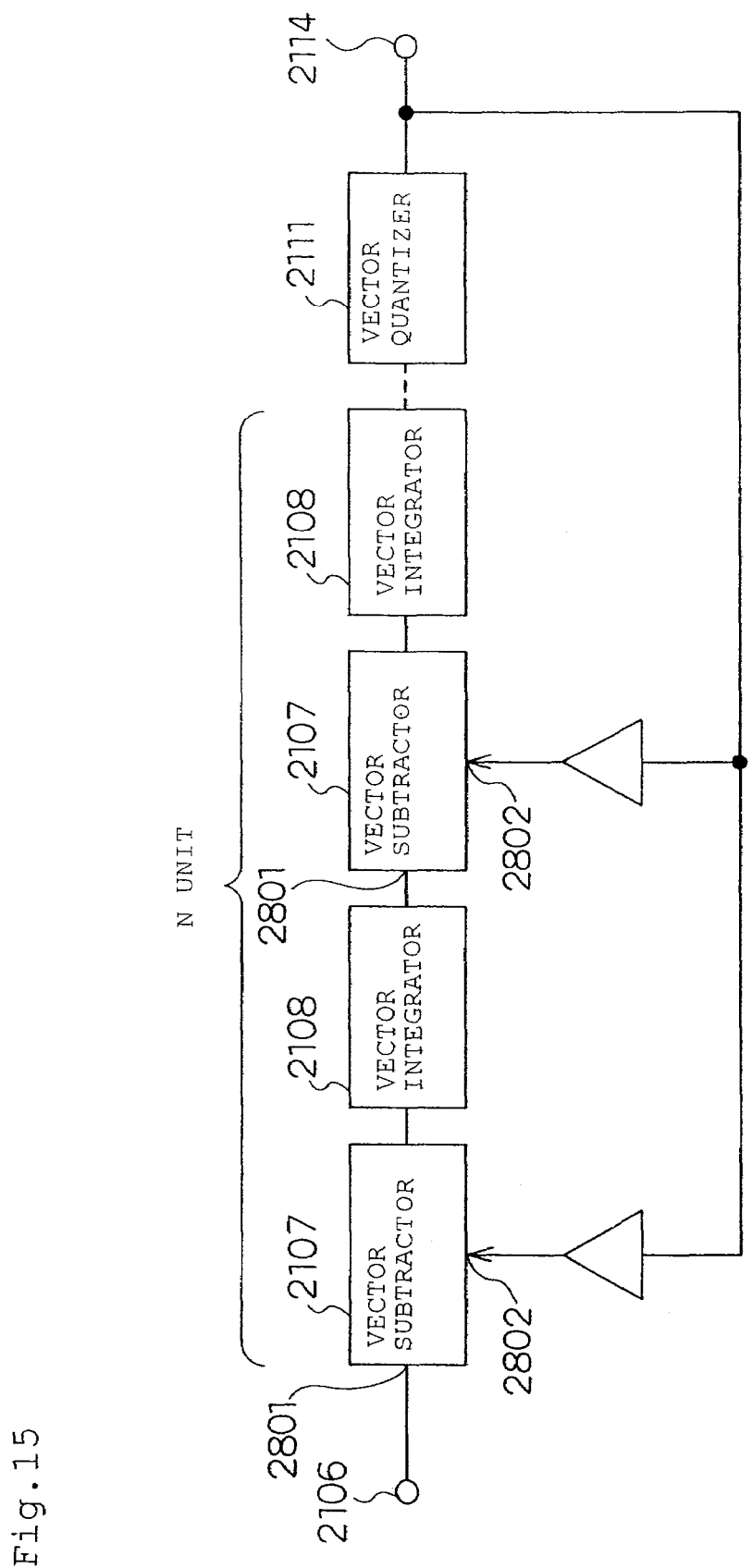
FIG. 15 is a block diagram showing a high order configuration example of a vector data converter.

In FIG. 15 is shown an n order (n is a natural number) configuration using the vector data converter 102.

That is, this configuration comprises an input terminal 2106 in which I and Q data are inputted, an arithmetic circuit connected to the input terminal 2106, a vector quantizer 2111 connected to the arithmetic circuit, and an output terminal 2114 connected to the vector quantizer 2111. The arithmetic circuit is a unit circuit connected in n pieces (n is a natural number) which has a vector subtractor 2107 having a first input terminal 2801 and a second input terminal 2802, and a vector integrator 2108 connected to the output side of the vector subtractor 2107. The output of the output terminal 2114 is inputted to all second input terminals 2802 of the vector subtractor 2107 of each unit circuit. The input terminal 2106 is connected to the first input terminal of the vector subtractor 2107 of a first unit circuit, and the above described each unit circuit is preferably configured such that the output terminal of the vector integrator 2108 and the first input terminal of the vector subtractor 2107 are connected. When such a higher order configuration is adapted, similarly to an ordinary delta sigma modulator, the noise in the vicinity of a desired wave frequency can be reduced much more.

Figure 16:
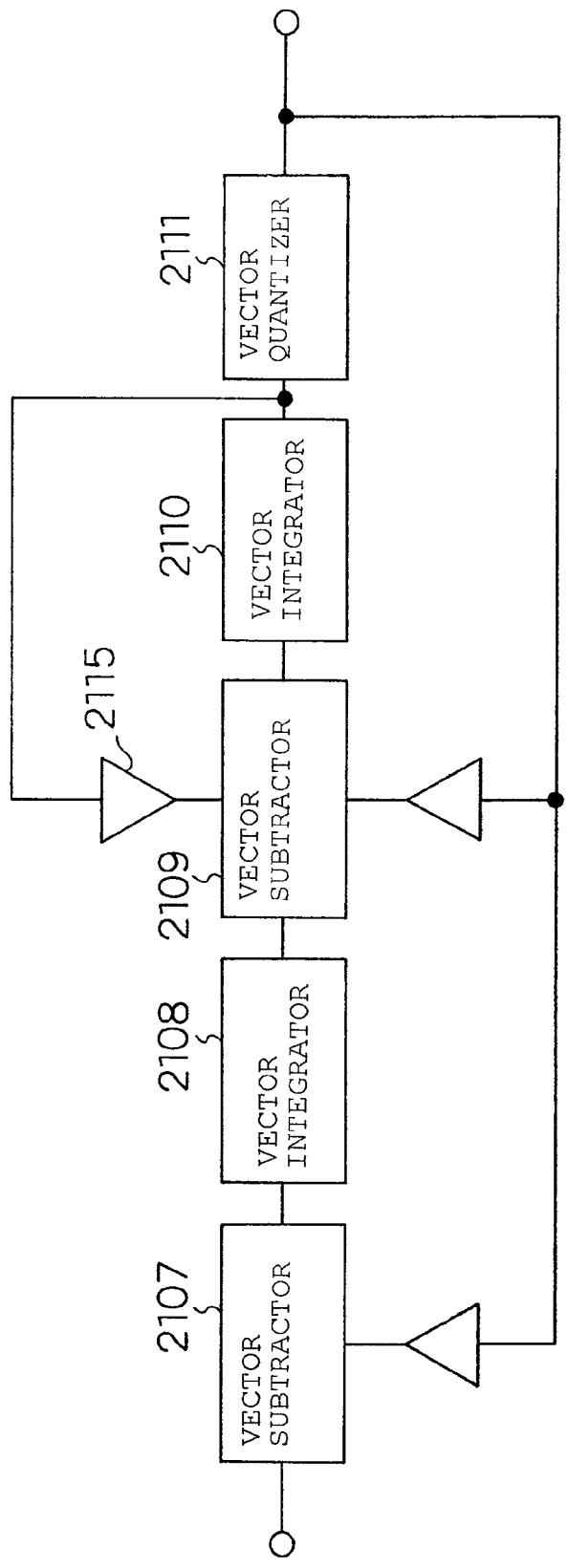
FIG. 16 is a block diagram showing a high order configuration example of a vector data converter.

In the configuration shown in FIG. 15, though a description has been made that the output of the vector quantizer 2111 is inputted to each subtractor 2107, the configuration may be altered such that the output of each integrator 2108 is inputted to each subtractor 2107. For example, as shown in FIG. 16, the output of the vector integrator 2110 may be amplified or attenuated in multiplication by scalars by the amplifier 2115 so as to be inputted to the vector subtractor 2109, or alternatively the output of the vector quantizer 2111 may be inputted to both or either of the vector subtractors 2107 and 2109 as a feedback. When the high order configuration such as FIG. 16 is adapted, similarly to an ordinary delta sigma modulator, the noise in the vicinity of a desired wave frequency can be reduced much more.

Figure 18B:
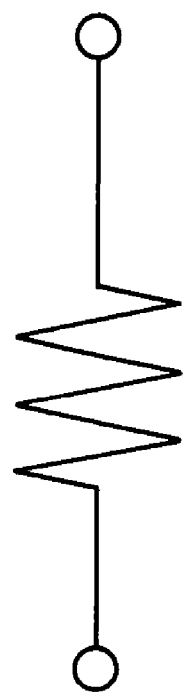
FIG. 18(b) is a block diagram showing a configuration example of the isolation unit using an attenuator.
Figure 18A:
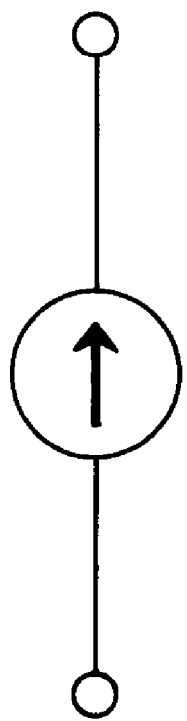
FIG. 18(a) is a block diagram showing a configuration example of an isolation unit using an isolator.

As the isolation unit 105, an isolator shown in FIG. 18(a) and an attenuator shown in FIG. 18(b) are used. That is, FIG. 18(b) shows that the attenuator is used as the isolation unit 105. However, as the attenuator shown in FIG. 18(b), an attenuator having an input coefficient of reflection smaller than the input coefficient of reflection of the filter 106 within the frequency range of a mean frequency ±fs/2 (fs is a sampling frequency of the data converter) of the filer 106 is used. Further, as the isolator shown in FIG. 18(a), an isolator having an input coefficient of reflection smaller than the input coefficient of reflection of the filter 106 within the frequency range of a mean frequency ±fs/2 (fs is a sampling frequency of the data converter) of the filer 106 is used.

In the present first embodiment 1, though a description has been made that, as the isolation unit 105, the attenuator and the isolator are used, it is not limited to this. As the isolation unit 105, it is preferable, if only a circuit or an element having an input coefficient of reflection smaller than the input coefficient of reflection of the filter 106 within the frequency range of a mean frequency ±fs/2 (fs is a sampling frequency of the data converter) of the filer 106 is used.

Figure 4:
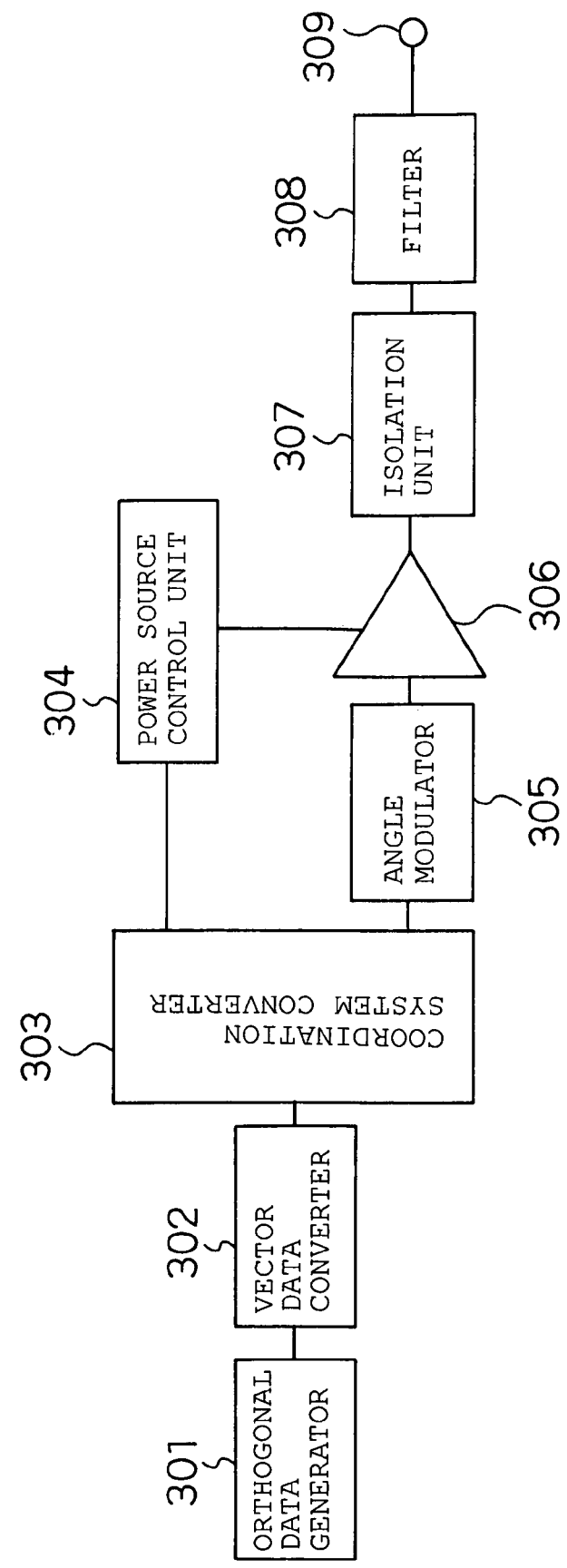
FIG. 4 is a block diagram showing a configuration example of the transmitting circuit according to the first embodiment of the present invention.

As the transmitting circuit of the first embodiment, it may be configured as shown in FIG. 4.

The transmitting circuit shown in FIG. 4 comprises an orthogonal data generator 301, a vector data converter 302, a coordination conversion unit 303, a power supply control unit 304, an angle modulator 305, an amplitude modulator 306, an isolation unit 307, a filter 308 and an output terminal 309.

The orthogonal data generator 301 and the vector data converter 302 are the same as the transmitting circuit of FIG. 1. Further, the isolation unit 307 and the filter 308 are the same as the isolation unit 105 and the filter 106 of the transmitting circuit in FIG. 1, respectively.

The output of the vector data converter 302 is connected to the coordination conversion unit 303. The one output of the coordination conversion unit 303 is connected to the input of the power source control unit 304, and the output of the power source control unit 304 is connected to the amplitude modulator 306. Further, the other output of the coordination conversion unit 303 is connected to the angle modulator 305, and the output of the angle modulator 305 is connected to the amplitude modulator 306. The output of the amplitude modulator 306 is connected to the isolation unit 307, and the output of the isolation unit 307 is connected to the input of the filter 308. The output of the filter 308 is connected to the output terminal 309.

The vector data converter 302, the coordination conversion unit 303, the angle modulator 305, and the power source control unit 304 in the present first embodiment are an example of the signal modulation converter circuit of the present invention, and the amplitude modulator 306 in the present first embodiment is an amplifier of the present invention.

Next, the operation of the transmitting circuit shown in FIG. 4 will be described.

The operations of the orthogonal data generator 301 and the vector data converter 302 are the same as that of the transmitting circuit of FIG. 1. The coordination conversion unit 303 converts the signal data-converted by the vector data converter 302 into an amplitude data and a phase data. The coordination conversion unit 303 inputs the amplitude data to the power source control unit 304, and inputs the phase data to the angle modulator 305. The angle modulator 305 angle-modulates the inputted phase data, and input it to the amplitude modulator 306.

In the meantime, the power source control unit 304 outputs a voltage proportional to the amplitude data inputted from the coordination conversion unit 303 to the amplitude modulator 306. The amplitude modulator 306 amplitude-modulates the inputted angle modulated wave with the output of the power source control unit 304. The amplitude modulator 306 can perform an amplitude modulation on a low distortion by the isolation unit 307 since the impedance of the output side is stabilized in a wide bandwidth as described above. The filter 308 receives an inputted signal from the isolation unit 307, and removes quantization noise generated in the vector data converter 302, and outputs them to the output terminal 309.

The power source control unit 304 of FIG. 4 can be configured by using a series regulator or a switching regulator.

Figure 5:
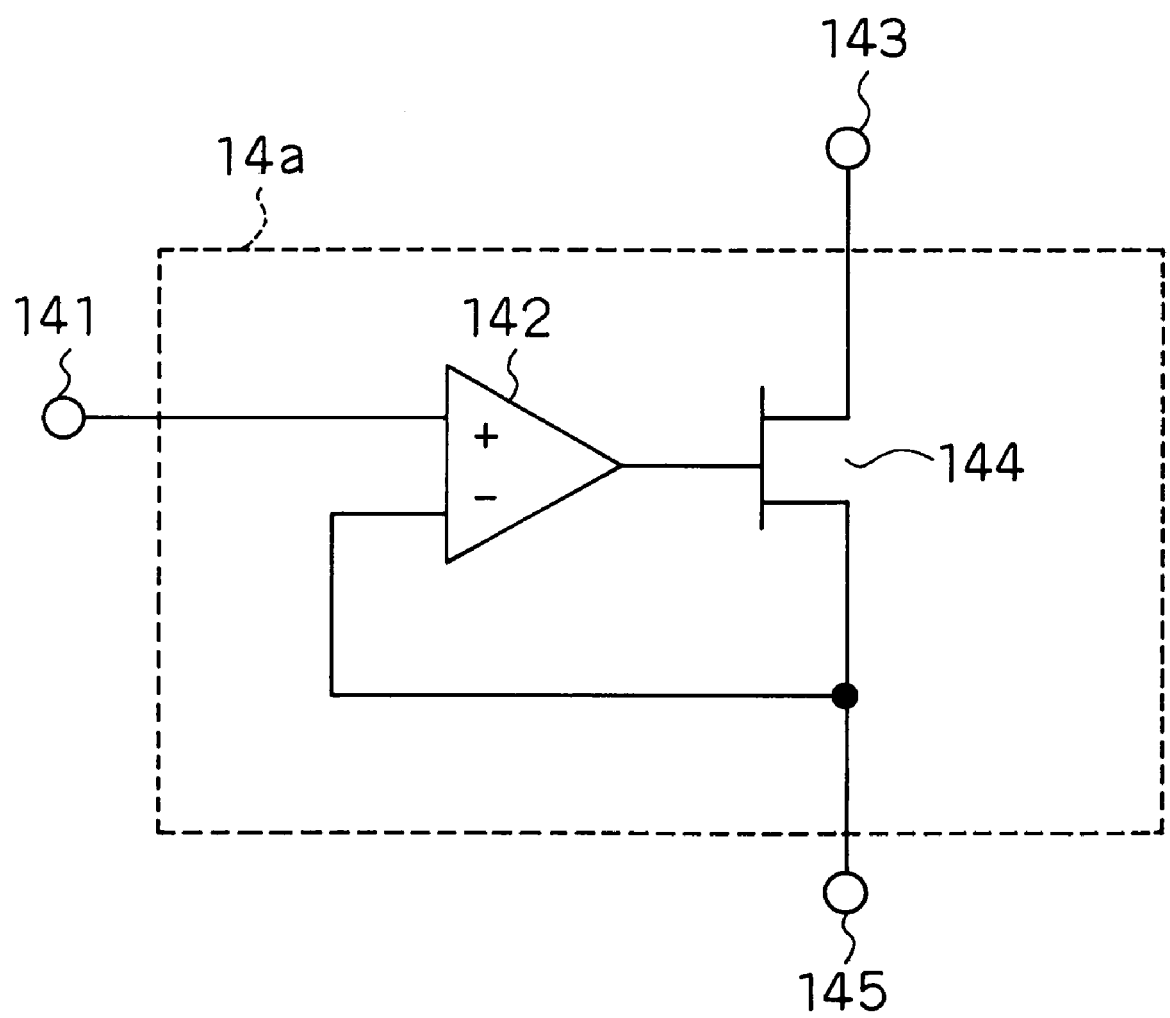
FIG. 5 is a block diagram showing a configuration example of a power source control unit adapting a serial regulator according to the first embodiment of the present invention.

In FIG. 5, as the power source control unit 304 of FIG. 4, a power source control unit 14a adopting a series regulator is shown. In FIG. 5, the power supply control unit 14a comprises an input terminal 141, a comparing unit 142, a power source terminal 143, a transistor 144, and an output terminal 145. For the transistor 144, a field effect transistor is supposed to be used.

The input terminal 141 is inputted with an amplitude signal from a delay adjusting unit (not shown). The amplitude signal is inputted to the gate of the transistor 144 through the comparing unit 142. The drain of the transistor 144 is supposed to be supplied with a direct voltage from the power source terminal 143. The transistor 144 outputs the voltage proportional to the inputted amplitude signal from the source. The voltage outputted from the source of the transistor 144 is fed back to the comparing unit 142. The comparing unit 142, based on the fed back voltage, adjusts the magnitude of the amplitude signal inputted to the gate of the transistor 144. In this way, the power source control unit 14a adapting the series regulator can stably supply the voltage proportional to the amplitude signal from the output terminal 145.

Figure 6:
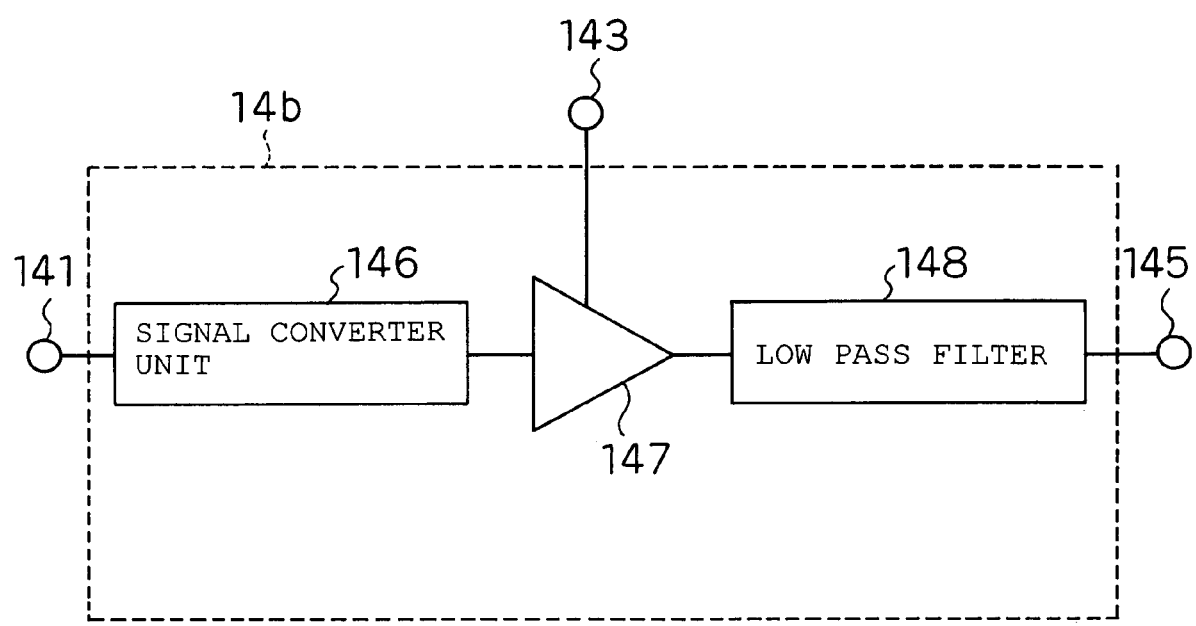
FIG. 6 is a block diagram showing a configuration example of a power source control unit providing a switching regulator according to the first embodiment of the present invention.

In FIG. 6, as the power source control unit 304 of FIG. 4, a power source control unit 14b which provides a switching regulator is shown. In FIG. 6, the power source control unit 14b comprises an input terminal 141, a power source terminal 143, a signal conversion unit 146, an amplifier unit 147, a low pass filter 148, and an output terminal 145.

The input terminal 141 is inputted with an amplitude signal from the delay adjusting unit (not shown). The amplitude signal is inputted to the signal conversion unit 146. The signal conversion unit 146 converts the inputted amplitude signal into a signal which is pulse-width-modulated or delta-sigma-modulated. The signal converted by the signal conversion unit 146 is inputted to the amplifier unit 147. The amplifier unit 147 amplifies and outputs the inputted signal. The amplifier unit 147 is supposed to be supplied with the direct current voltage from the power source terminal 143. Further, as the amplifier 147, a highly efficient switching amplifier such as a class D type is used. In this way, the power source control unit 14b adapting the switching regulator can stably supply the voltage proportional to the amplitude signal from the output terminal 145.

Although a description has been made that the angle modulator 305 of the present embodiment performs the angle-modulation of the inputted phase data, this angle modulation includes a frequency modulation and a phase modulation.

Second Embodiment

A second embodiment of the present invention will be described by using FIG. 7.

Figure 7:
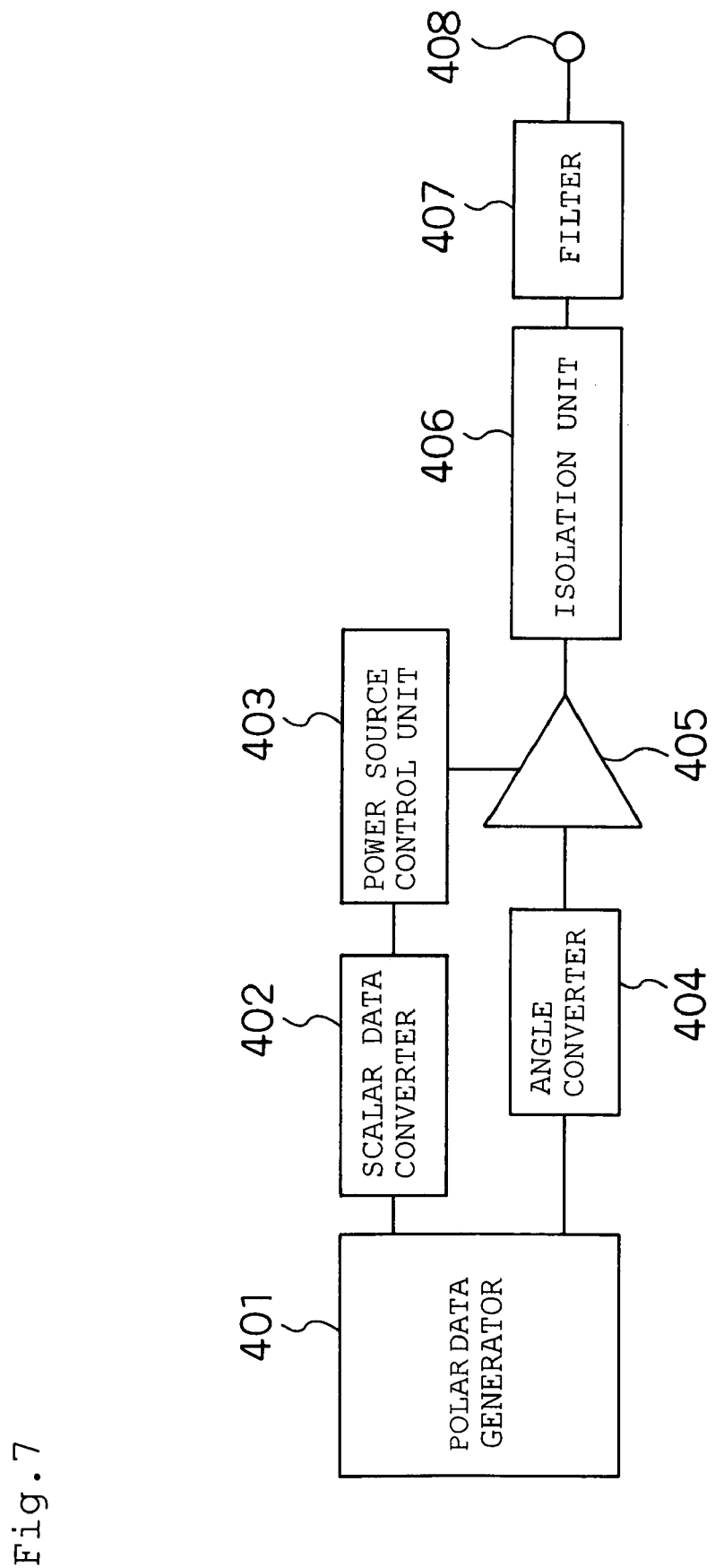
FIG. 7 is a block diagram showing a configuration example of the transmitting circuit according to a second embodiment of the present invention.

A transmitting circuit device of FIG. 7 comprises a polar data generator 401, a scalar data converter 402, a power source control unit 403, an angle modulator 404, an amplitude modulator 405, an isolation unit 406, a filter 407, and a terminal 408.

The one output of the polar data generator 401 is connected to the input of the scalar data converter 402, the output of the scalar data converter 402 is connected to the input of the power source control unit 402, and the output of the scalar data converter 402 is connected to the amplitude modulator 405. In the meantime, the other output of the polar data generator 401 is connected to the input of the angle modulator 404, and the output of the angle modulator 404 is connected to the amplitude modulator 405. The output of the amplitude modulator 405 is connected to the input of the isolation unit 406, and the output of the isolation unit 406 is connected to the input of the filter 407. The output of the filter 407 is connected to the output terminal 407.

The scalar data converter 402, the angle modulator 404, and the power source control unit 403 in the present second embodiment are one example of the signal modulation conversion circuit of the present invention, and the amplitude modulator 405 in the present second embodiment is an example of the amplitude modulator of the present invention.

Next, the operation of the present embodiment will be described.

From the polar data generator 401, an amplitude data and a phase data are outputted. The amplitude data is inputted to the scalar data converter 402, and is data-converted. In the scalar data converter 402, the signal smaller in resolution than the inputted signal, that is, the signal having the number of voltage values to be obtained smaller than the inputted signal is outputted. As the scalar data converter 402, a delta sigma converter and the like such as shown in FIG. 14 is used. The output from the scalar data converter 402 is inputted to the power source control unit 403, and the power source control unit 403 outputs the signal proportional to the inputted signal to the amplitude modulator 405.

As the power source control unit 403, similarly as described in the first embodiment, the power source control unit 14a shown in FIG. 5 and the power source control unit 14b shown in FIG. 6 can be used. In the meantime, the phase data is inputted to the angle modulator 404, and is angle-modulated. The output of the angle modulator 404 is inputted to the amplitude modulator 405, and is amplitude-modulated from the output signal from the power source control unit 403. Since the operation of the isolation unit 406 has been described in the first embodiment, the description thereof will be omitted. Further, since the operation of the filter 407 has been also described in the first embodiment, the description thereof will be omitted.

As the isolation unit 406, similarly as described in the first embodiment, the isolator and the attenuator are used as shown in FIGS. 18(a) and 18(b).

Figure 17:
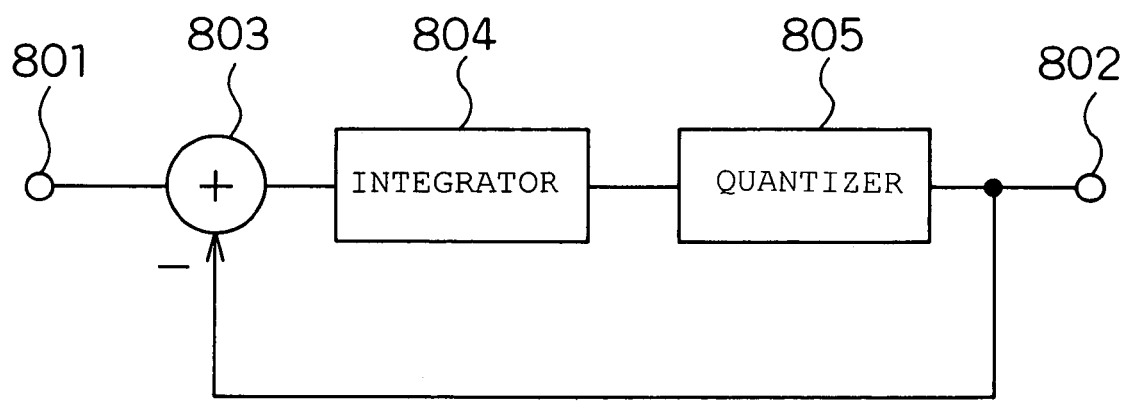
FIG. 17 is a block diagram showing a configuration example of the delta sigma modulator.

As the scalar data converter 402, the delta sigma modulator as shown in FIG. 17 can be used.

The delta sigma modulator shown in FIG. 17 comprises an input terminal 801, a subtractor 803, an integrator 804, a quantizer 805, and an output terminal 802.

The input terminal 801 is connected to one end of the input side of the subtractor 803. Further, the output side of the subtractor 803 is connected to the integrator 804, and the output of the integrator 804 is connected to the quantizer 805, and the output thereof is connected to the output terminal 802. Further, the output of the quantizer 805 is inputted from the other input side of the subtractor 803.

Next, the operation of the delta sigma modulator will be described. The input terminal 801 is inputted with a signal. The inputted signal is inputted to the integrator 804 through the subtractor 803. In the integrator 804, the signal is integrated. The integrated result is inputted to the quantizer 805.

First, a description will be made on the case where the quantizer 805 quantizes a magnitude of the signal. Assuming that 0<a (a is a real number), depending on the magnitude of the input signal to the quantizer 805, a signal having a magnitude of a or 0 is outputted. As a method of quantization, for example, when the magnitude of the input signal is smaller than a, which is a threshold value, the magnitude of the output signal is taken as 0, and when the magnitude of the input signal is not smaller than a, the magitude of the output signal is taken as a. Although there is no particular restriction imposed on the phase of this output signal, it is considered to be a typical example to make it the same as the phase of the input signal to the quantizer 805. This output is outputted from the output terminal 802, and at the same time, it is subjected to a subtraction treatment at the subtractor 803. In the subtractor 803, to be more specific, an operation is performed, in which the signal outputted from the quantizer 805 is subtracted from the signal inputted from the input terminal 801.

Third Embodiment

A third embodiment of the present invention will be described by using FIG. 8.

Figure 8:
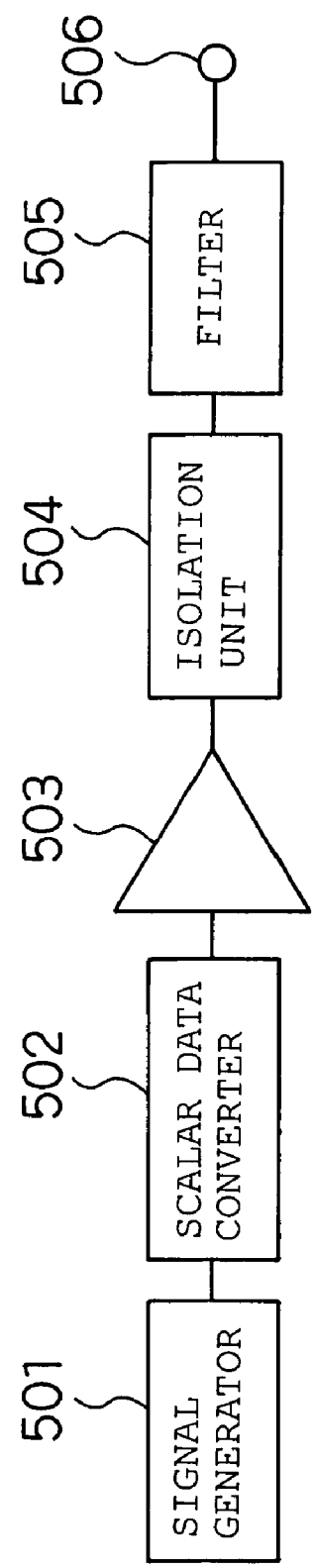
FIG. 8 is a block diagram showing a configuration example of the transmitting circuit according to a third embodiment of the present.

The transmitting circuit of the present third embodiment shown in FIG. 8 comprises a signal generator 501, scalar data converter 502, an amplifier 503, an isolation unit 504, a filter 505, and an output terminal 506.

The output of the signal generator 501 is connected to the input of the scalar data converter 502, and the output of the scalar data converter 502 is connected to the input of the amplifier 503. The output of the amplifier 503 is connected to the isolation unit 504, and the output of the isolation unit 504 is connected to the input of the filter 505. The output of the filter 505 is connected to the output terminal 506.

The scalar data converter 502 in the present third embodiment is an example of the signal modulation conversion circuit of the present invention.

Next, the operation of the present embodiment will be described.

The signal generator 501 outputs a modulated signal. The signal outputted from the signal generator 501 is inputted to the scalar data converter 502, and is converted into a signal of a low resolution. That is, it is converted into a signal having the number of voltage values obtainable smaller than the inputted signal. Typically, it is converted into a series of numerals comprising 0 and a real number. As the scalar data converter 502, for example, the delta sigma modulator of a band pass type is used. The output of the scalar data converter 502 is inputted to the amplifier 503, and is amplified. Since the input signal to the amplifier 503, for example, is dispersed into a binary value, a high efficient switching amplifier such as a class D and a class E can be used. The output of the amplifier 503 is connected to the isolation unit 504, avoiding effects of out of band impedance of the subsequent filter 505. In this way, amplification of a low distortion can be realized by the amplifier 503. In the filter 505, the quantization noise generated in the scalar data converter 502 is removed, and is outputted from the output terminal 506.

Here, though a description has been made that, as the scalar data converter 502, for example, the delta sigma modulator of a band pass type is used, with respect to this point, a description will be made by using FIGS. 9, 10, 11, and 12.

Figure 9:
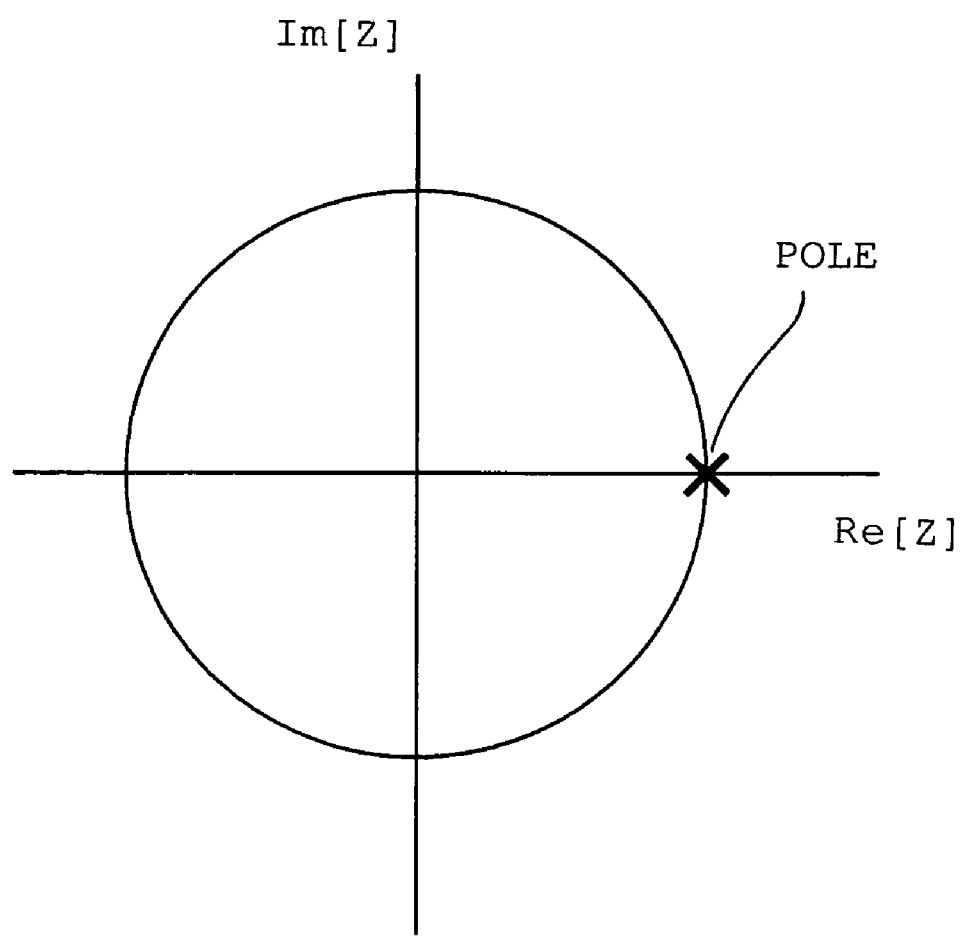
FIG. 9 is a view showing the position of a zero point in a noise transfer function in which the zero point is 1 according to the third embodiment of the present invention.
Figure 10:
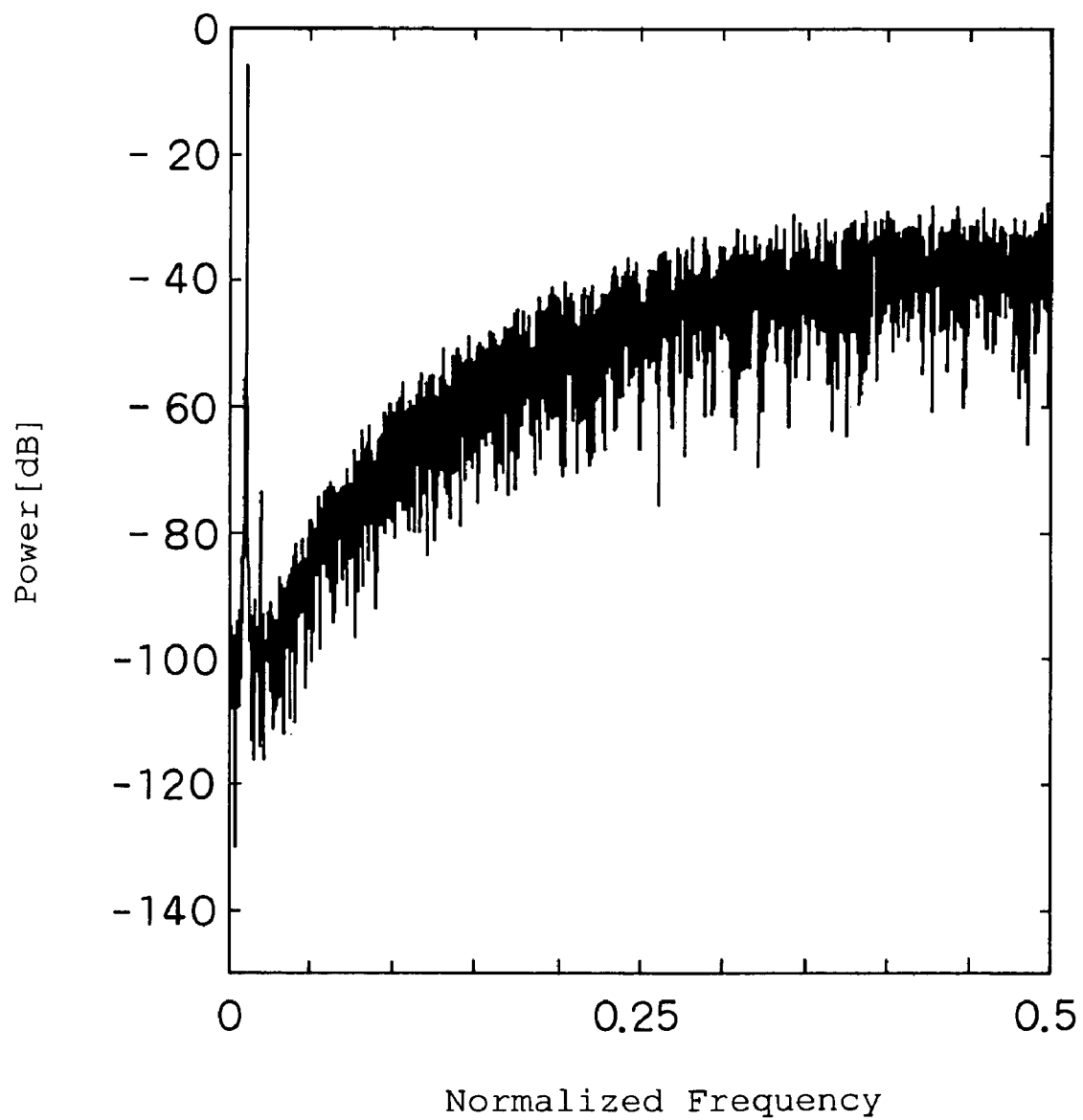
FIG. 10 is a view showing one example of the spectrum of a signal outputted from a scalar data converter in which the zero point of the noise transfer function is 1 according to the third embodiment of the present invention.

FIG. 9 is a view showing the position of a zero point in a noise transfer function in which a zero point is 1. FIG. 10 is a view showing one example of the spectrum of a signal outputted from the scalar data converter 502 in which the zero point of the noise transfer function is 1. As shown in FIG. 10, the signal outputted from the scalar data converter 502 in which the zero point of the noise transfer function is 1 becomes a direct current (0 Hz) in frequency in which the quantization noise signal is the smallest.

That is, in FIG. 9, in case the scalar data converter 502, in which the zero point of the noise transfer function is 1, is used, the filter 505 uses a low pass filter, and removes a out of band quantization noise.

In case such a scalar data converter 502 is configured by using the delta sigma modulator, it can be configured by using the delta sigma modulator of a low pass type.

Figure 11:
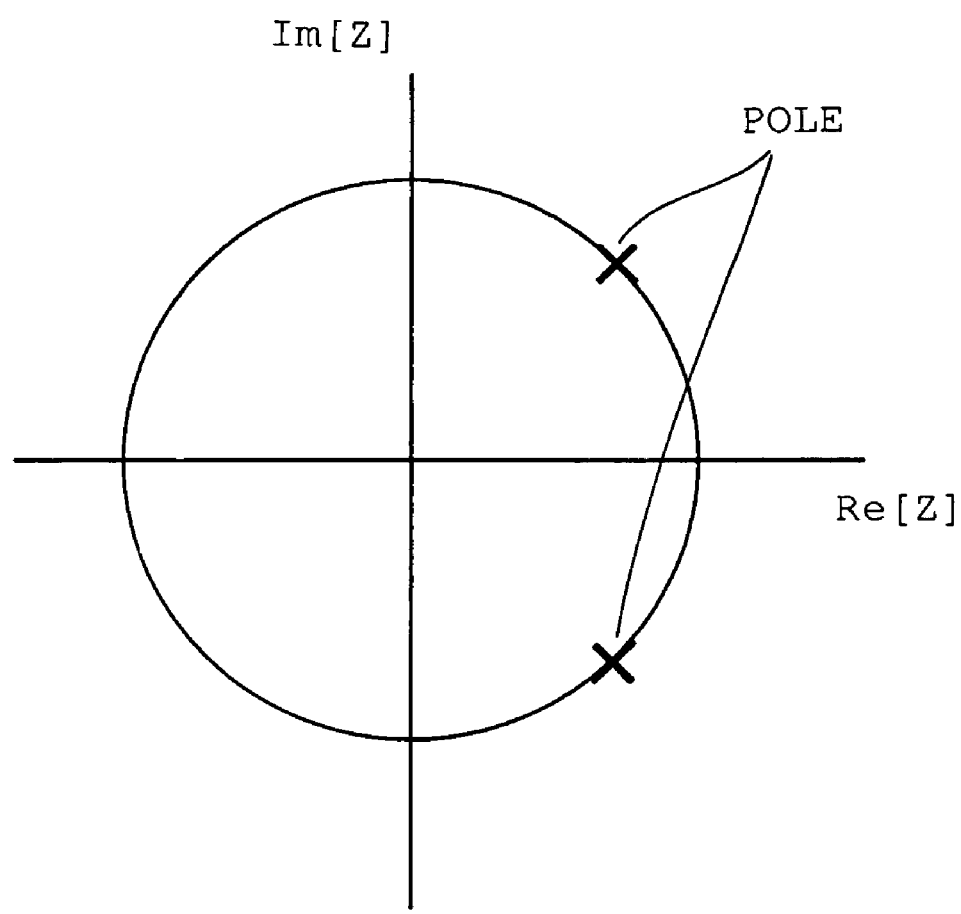
FIG. 11 is a view showing the position of the zero point of the noise transfer function in which the zero point is a complex number having magnitude of 1 according to the third embodiment of the present invention.
Figure 12:
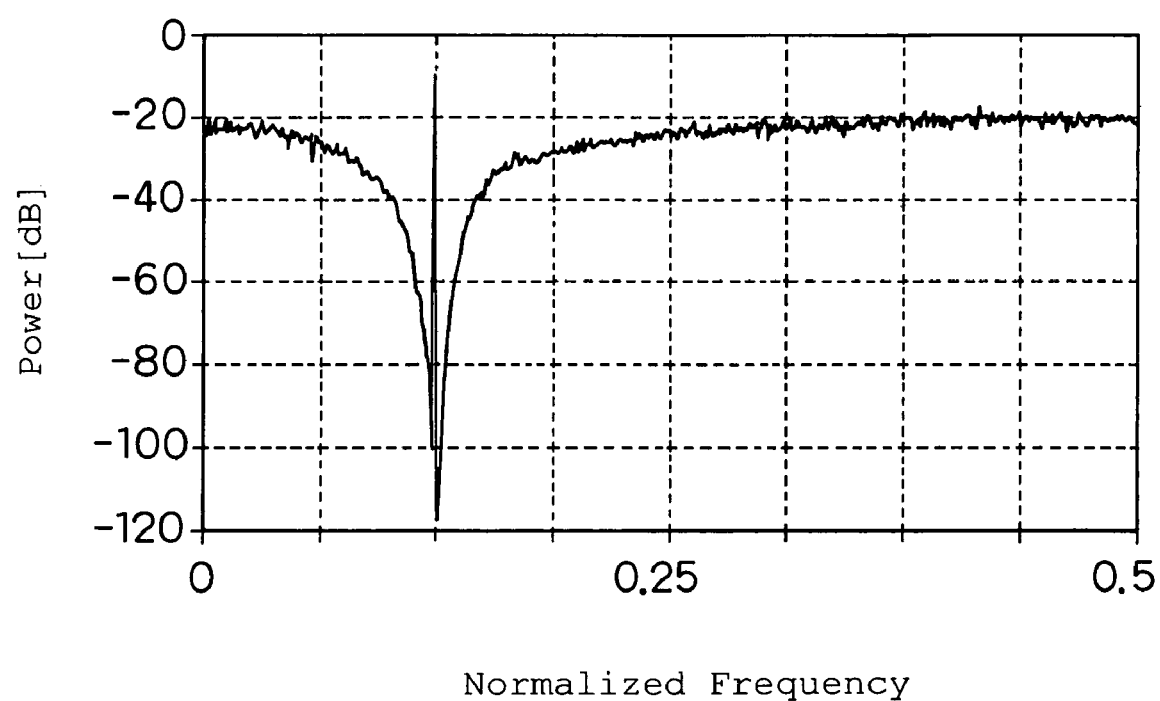
FIG. 12 is a view sowing one example of the spectrum of a signal outputted from a scalar data converter in which the zero point of the noise transfer function is the complex number having the magnitude of 1 according to the third embodiment of the present invention.

FIG. 11 is a view showing the position of a zero point of the noise transfer function in which the zero point is a complex number which amplitude is 1. In FIG. 11 is shown the case where the position of the zero point of the noise transfer function is 1 in magnitude and is ±π/4 argument. FIG. 12 shows one example of the spectrum of a signal outputted from the scalar data converter 502 in which the zero point of the noise transfer function is a complex number having a magnitude of 1. As shown in FIG. 12, the signal outputted from the scalar data converter 502 in which the zero point of the noise transfer function is a complex number having a magnitude of 1 becomes a normalized frequency in which a frequency smallest in the quantization noise divides an argument of zero point by 2π.

The scalar data converter 502 is designed such that the frequency of a desired wave frequency becomes close to the frequency in which the quantization noise becomes the smallest.

That is, in FIG. 11, in case the scalar data converter 502, in which the zero point of the noise transfer function is a complex number having a magnitude of 1, is used, the filter 505 uses a band pass filter, and removes the out of band quantization noise.

In case such a scalar data converter 502 is configured by using the delta sigma modulator, it can be configured by using the delta sigma modulator of a band pass type.

As described above, a description has been made on the availability of the delta sigma modulator of a band pass type as the scalar data converter 502.

As the isolation unit 504, similarly as described in the first embodiment, the isolator and the attenuator are used as shown in FIGS. 18(a) and 18(b). Since the isolation unit 504 is the same as the isolation unit 105 descried in the first embodiment, the detailed description thereof will be omitted.

Further, since the operation of the filter 505 is also the same as the operation of the filter 106 described in the first embodiment, the description thereof will be omitted.

Fourth Embodiment

A fourth embodiment of the present invention will be described by using FIG. 19.

Figure 19:
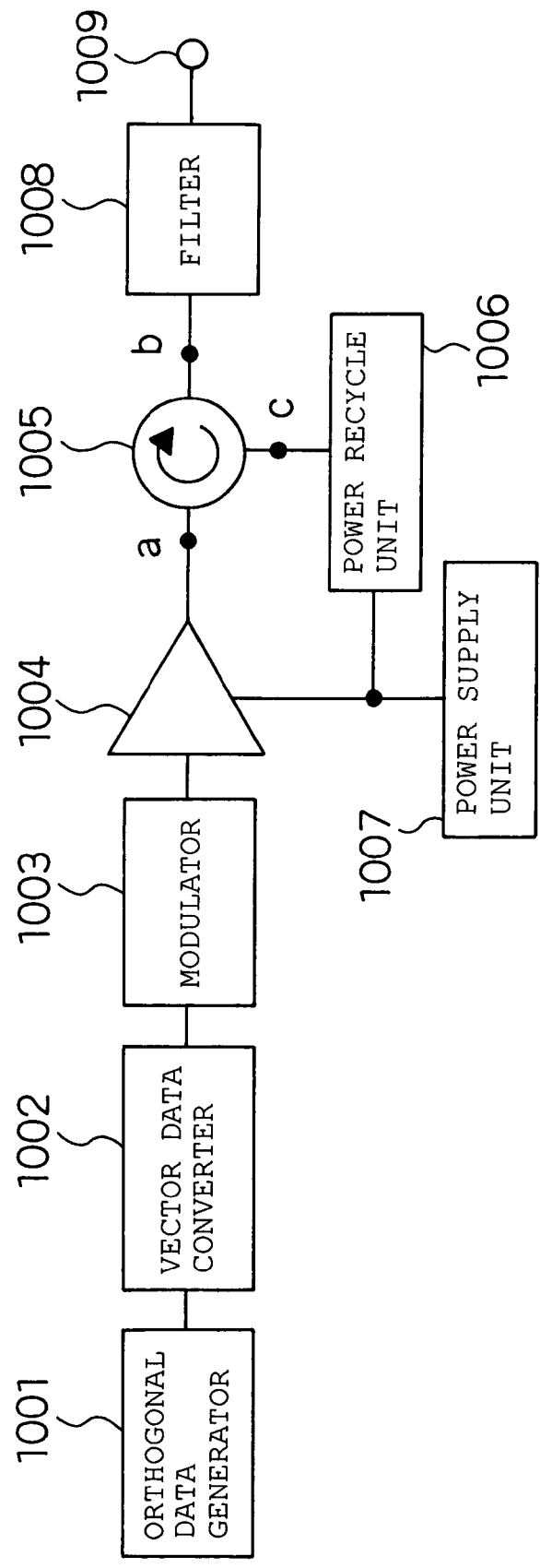
FIG. 19 is a block diagram showing a configuration example of the transmitting circuit according to a fourth embodiment of the present invention.

The transmitting circuit of the present fourth embodiment shown in FIG. 19 comprises an orthogonal data generator 1001, a vector data converter 1002, a modulator 1003, an amplifier 1004, a circulator 1005, an power recycle unit 1006, an power supply unit 1007, a filter 1008, and an output terminal 1009.

The output of the orthogonal data generator 1001 is connected to the vector data converter 1002, and the output of the vector data converter 1002 is connected the input of the modulator 1003. The output of the modulator 1003 is connected to the amplifier 1004. The amplifier 1004 is supplied with the power from the power supply unit 1007 and the power recycle unit 1006, and the output of the amplifier 1004 is connected to a terminal a of the circulator 1005. Further, a terminal b of the circulator 1005 is connected to the input of the filter 1008, and the output of the filter 1008 is connected to the output terminal 1009. A terminal c of the circulator 1005 is connected to the power recycle unit 1006.

The vector data converter 1002 and the modulator 1003 in the present fourth embodiment are an example of the signal modulation conversion circuit of the present invention.

Next, the operation of the present embodiment will be described.

The orthogonal date generator 1001 outputs a baseband data.

The vector data converter 1002 quantizes a baseband data outputted from the orthogonal data generator 1001 regarding the magnitude of the vector. For example, the vector data converter 1002 quantizes the inputted baseband data so as to become a binary data having 0 and a real number in magnitude. The output of the vector data converter 1002 is inputted to the modulator 1003, and is modulated. As the modulator 1003, an orthogonal modulator is typically used. The output of the modulator 1003 is amplified by the amplifier 1004. The power of the amplifier 1004 is supplied from the power supply unit 1007. At the output of the modulator 1003, a signal is outputted in which a magnitude of envelope is quantized and which is generated by turning a constant envelop ON and OFF. Hence, as the amplifier 1004, an amplifier capable of the operation of a class D and a class E of high efficiency can be used. The output of the amplifier 1004 is inputted to the filter 1008 through the circulator 1005. In the filter 1008, an unnecessary quantization noise generated in the vector data converter 1002 is removed, and the signal with the unnecessary quantization noise removed therefrom is outputted from the output terminal 1009. However, the gain of the amplifier 1004 must be approximately constant within the frequency range of a mean frequency ±fs/2 (fs is the sampling frequency of the data converter). Hence, to mitigate the effect of the out of band impedance of the filter 1008, the circulator 1005 is inserted as an isolation unit. The circulator 1005 has the most signal inputted from a terminal a transmitted to a terminal b, and the most signal inputted from the terminal b transmitted to a terminal c, and the most signal inputted from the terminal c to the terminal a. That is, though the signal passes through from the terminal a to the terminal b, and from the terminal b to the terminal c, and from the terminal c to the terminal a, the signal does not pass through from the terminal b to the terminal a, and from the terminal c to the terminal b, and from the terminal a to the terminal c.

Consequently, the signal including both the desired signal and the unnecessary quantization noise is outputted from the amplifier 1004, and is inputted to the filter 1008 through the circulator 1005. While the filter 1008 allows the frequency having the desired signal to pass through, it throws back the signal of the frequency having a number of quantization noise. Hence, the signal thrown back by the input of the filter 1008 is inputted from the terminal b of the circulator 1005.

The quantization noise signal inputted from the terminal b is outputted from the terminal c, and is inputted to the power recycle unit 1006. The power recycle unit 1006 converts the inputted high frequency signal into a direct current signal of the same voltage as the output of the power supply unit 1007. The output of the power recycle unit 1006 is recycled as the power supplied to the amplifier 1004. Hence, a total power consumption of the transmitting circuit can be reduced.

Figure 20:
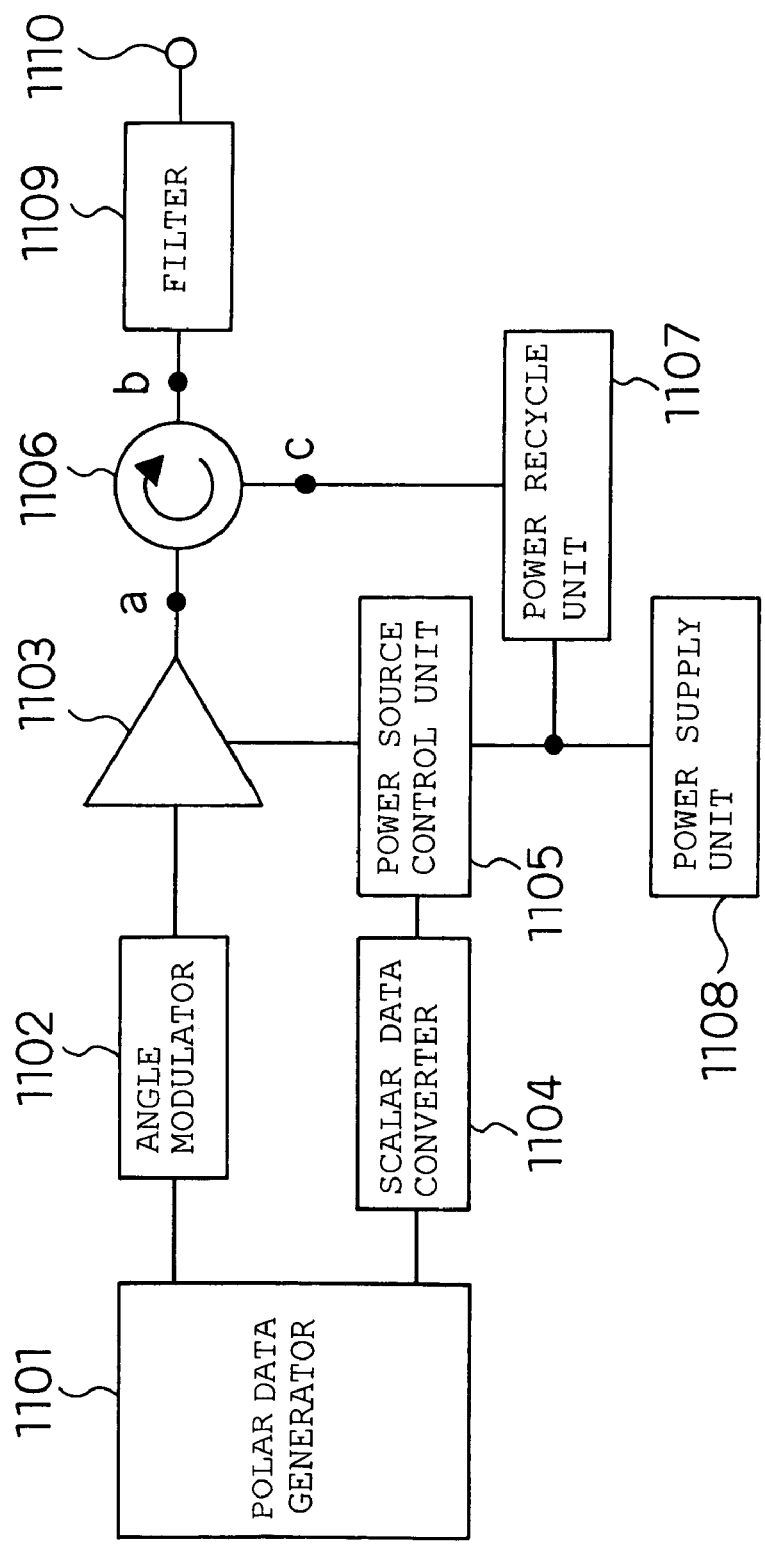
FIG. 20 is a block diagram showing a configuration example of the transmitting circuit according to the fourth embodiment of the present invention.
Figure 21:
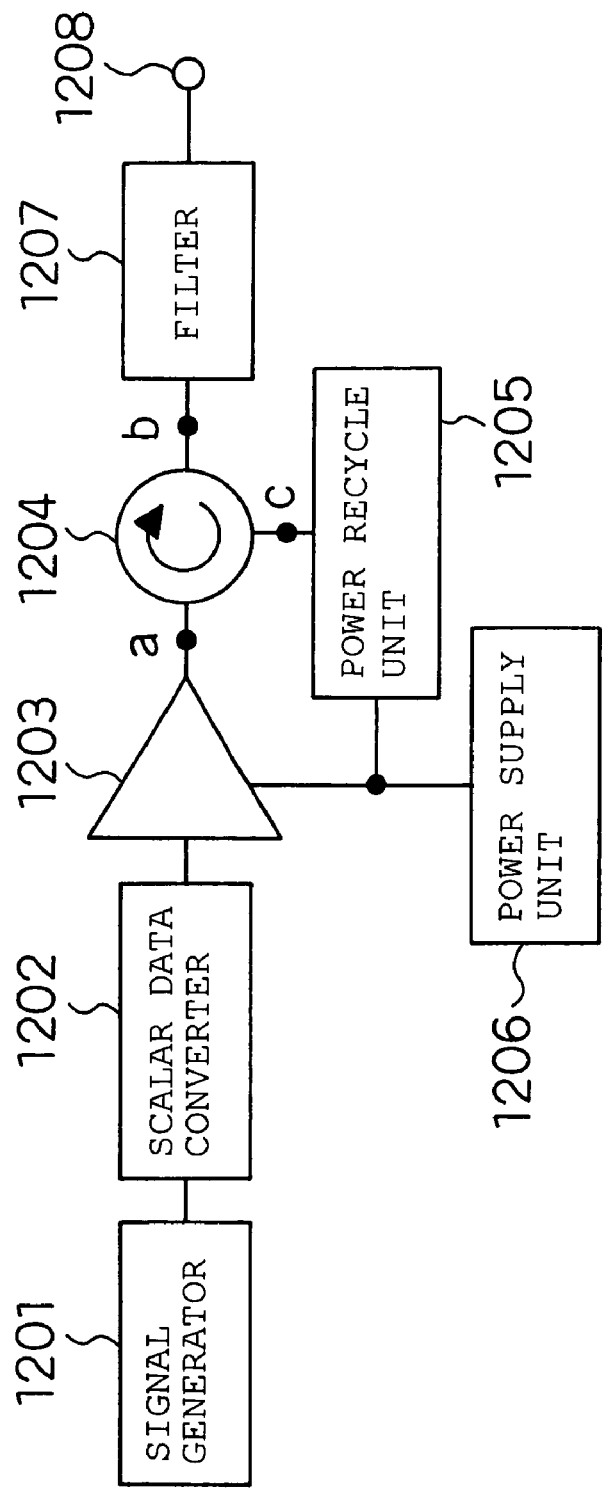
FIG. 21 is a block diagram showing a configuration example of the transmitting circuit according to the fourth embodiment of the present invention.

The same applies to FIGS. 20 and 21, and energy of the quantization noise thrown back by the filters 1109 and 1207 is converted into the direct current signal by the power recycle units 1107 and 1205, and is recycled as the supply power of the amplitude modulator 1103 and the amplifier 1203, thereby reducing the consumption power of the transmitting circuit.

The transmitting circuit shown in FIG. 20 comprises a polar data generator 1101, an angle modulator 1102, an amplitude modulator 1103, a data converter 1104, a power source control unit 1105, a circulator 1106, a power recycle unit 1107, a power supply unit 1108, a filter 1109, and an output terminal 1110.

The one output of the polar data generator 1101 is connected to the angle modulator 1102, and the output of the angle modulator 1102 is connected to the amplitude modulator 1103. In the meantime, the other output of the polar data generator 1101 is connected to the scalar data converter 1104, and the output of the scalar data converter 1104 is connected to the power source control unit 1105. The power source control unit 1105 receives the supply of the direct current voltage from the power supply unit 1108 and the power recycle unit 1107, and supplies a stable signal proportional to the output of the data converter 1104 to the amplitude modulator 1103. Further, the output of the amplitude modulator 1103 is connected to a terminal a of the circulator 1106. A terminal b of the circulator 1106 is connected to the input of the filter 1109, and the output of the filter 1109 is connected to the output terminal 1110. Further, a terminal c of the circulator 1106 is connected to the power recycle unit 1107.

The scalar data converter 1104 and the angle modulator 1102 in the present fourth embodiment are an example of the signal modulation conversion circuit of the present invention, and the amplitude modulator 1103 in the present fourth embodiment is an example of the amplifier of the present invention.

Next, the operation of the transmitting circuit shown in FIG. 20 will be described.

From the polar data generator 1101, an amplitude data and a phase data are outputted. The amplitude data is inputted to the scalar data converter 1104, and is data-converted. In the scalar data converter 1104, the signal smaller in resolution than the inputted signal, that is, the signal having the number of voltage values to be obtained smaller than the inputted signal is outputted. As the scalar data converter 1104, a delta sigma modulator and the like such as shown in FIG. 14 is used. The output from the scalar data converter 1104 is inputted to the power source control unit 1105, and the power source control unit 1105 outputs the signal proportional to the inputted signal to the amplitude modulator 1103.

As the power source control unit 1105, similarly as described in the first embodiment, the power source control unit 14a shown in FIG. 5 and the power source control unit 14b shown in FIG. 6 can be used. In the meantime, the phase data is inputted to the angle modulator 1102, and is angle-modulated. The output of the angle modulator 1102 is inputted to the amplitude modulator 1103, and is amplitude-modulated by the output signal from the power source control unit 1105.

Since the operations of the circulator 1106, the filter 1109, and the power recycle unit 1107 are the same as the transmitting circuit in FIG. 19, the description thereof will be omitted.

Thus, the transmitting circuit shown in FIG. 20 has been described.

Next, the transmitting circuit shown in FIG. 21 will be described.

The transmitting circuit shown in FIG. 21 comprises a signal generator 1201, a scalar data converter 1202, an amplifier 1203, a circulator 1204, a power recycle unit 1205, a power supply unit 1206, a filter 1207, and an output terminal 1208.

The output of the signal generator 1201 is connected to the input of the scalar data converter 1202, and the output of the scalar data converter 1202 is connected to the input of the amplifier 1203. The output of the amplifier 1203 is connected to a terminal a of the circulator 1204. Further, the amplifier 1203 is supplied with the direct current power from the power supply unit 1206 and the power recycle unit 1205. Further, a terminal b of the circulator 1204 is connected to the input of the filter 1207, and the output of the filter 1207 is connected to the output terminal 1208. The terminal c of the circulator 1204 is connected to the power recycle unit 1205.

The scalar date converter 1202 in the present fourth embodiment is an example of the signal modulation conversion circuit of the present invention.

Next, the operation of the transmitting circuit shown in FIG. 21 will be described.

The signal generator 1201 outputs a modulated signal. The signal outputted from the signal generator 1201 is inputted to the scalar data converter 1202, and is converted into a signal of a low resolution. That is, it is converted into a signal having the number of voltage values obtainable smaller than the inputted signal. Typically, it is converted into a series of numerals comprising 0 and a real number. As the scalar data converter 1202, for example, the delta sigma modulator of a band pass type is used. The output of the scalar data converter 1202 is inputted to the amplifier 1203, and is amplified. Since the input signal to the amplifier 1203, for example, is dispersed into a binary value, a high efficient switching amplifier such as a class D and a class E can be used. The output of the amplifier 1203 is inputted to the terminal a of the circulator.

The operations of the circulator 1204, the filter 1207, and the power recycle unit 1205 are same as the transmitting circuit of FIG. 19, and therefore, the description thereof will be omitted.

Thus, the transmitting circuit shown in FIG. 21 has been described.

Figure 22:
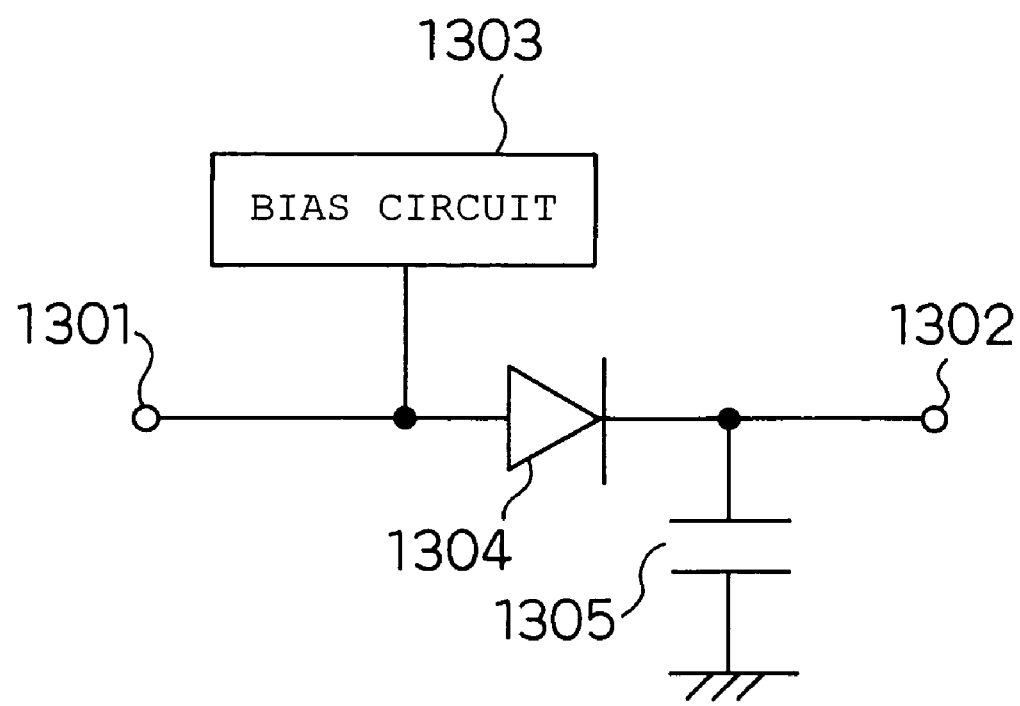
FIG. 22 is a block diagram showing a configuration example of a power recycle unit.

Now, as one example of the power recycle unit, a circuit such as FIG. 22 is conceivable.

The power recycle unit of FIG. 22 comprises an input terminal 1301, an output terminal 1302, a bias circuit 1303, a diode 1304, and a capacitor 1305.

The bias circuit 1303 is connected to a direct current source (not shown), and supplies a bias voltage to the diode 1304. The bias circuit 1303 is inputted with a high frequency signal from the input terminal 1301. The high frequency signal inputted from the input terminal 1301 is converted into a low frequency signal by the diode 1304, and is rectified by the capacitor 1305, and is outputted to the output terminal 1302. The diode 1304, as described above, is supplied with the bias voltage from the bias circuit 1303. For example, as the bias circuit 1303 for supplying the voltage of 0 V, a choke inductor being high in impedance is used for the input signal frequency, the other end of which is grounded. The output of the diode 1304 is connected in parallel to the capacitor 1305, the other end of which is grounded, and as described above, is supplied with the direct current signal from the output terminal 1302. The output terminal 1302 is connected to the outputs of the power supply units 1007, 1108, 1206 so as to be at the same electric potential.

Figure 23:
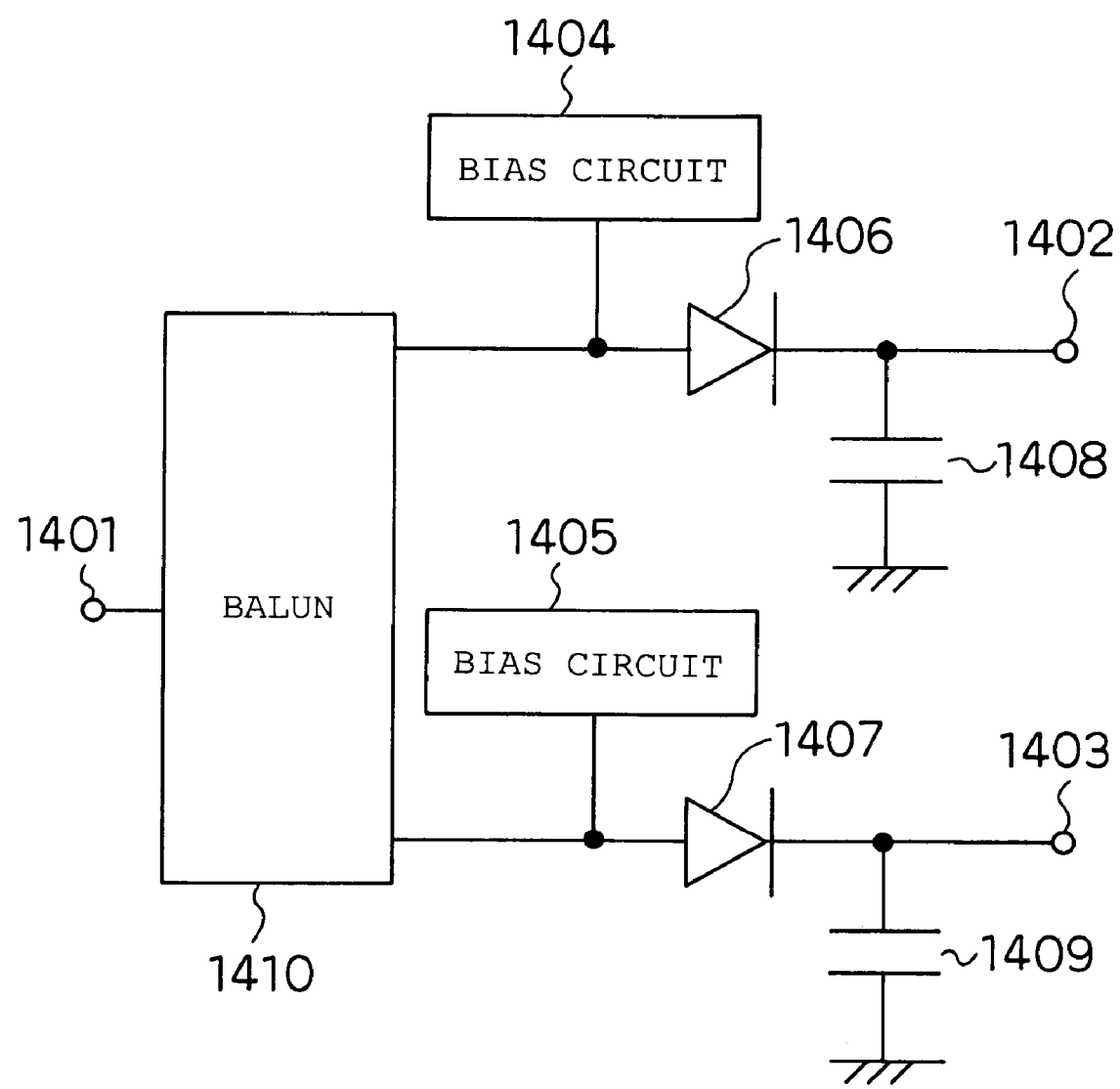
FIG. 23 is a block diagram showing a configuration example of a power recycle unit.

Further, a configuration of FIG. 23 is also conceivable, in which the configuration of FIG. 22 is realized in a balance circuit and the basic operation of FIG. 23 is the same as FIG. 22.

That is, the power recycle unit of FIG. 23 comprises an input terminal 1401 which is an unbalanced terminal, a pair of output terminals 1402 and 1403 which are balanced terminals, a balun 1410 which converts an unbalanced signal into a balanced type signal, a pair of bias circuits 1404 and 1405, a pair of diodes 1406 and 1407, and a pair of capacitors 1408 and 1409.

The bias circuits 1404 and 1405 are connected to a direct current source (not shown), and the bias circuits 1404 and 1405 supply a bias voltage to the diodes 1406 and 1407, respectively. A high frequency signal is inputted from the input terminal 1401, and the inputted high frequency signal is converted into the balanced signal in the balun 1401. The high frequency signal converted into the balanced signal in the baun 1410 is converted into low frequency signals by the diodes 1406 and 1407, respectively, and are rectified by the capacitors 1408 and 1409, and are outputted from the output terminals 1402 and 1403.

In this way, as the power recycle unit, the unbalanced circuit such as shown in FIG. 22 can be used, and the balanced circuit such as shown in FIG. 23 can be also used.

Fifth Embodiment

Next, a fifth embodiment will be described.

In the fifth embodiment, the equipment using the transmitting circuits described in the first to the fourth embodiments will be described.

Figure 24:
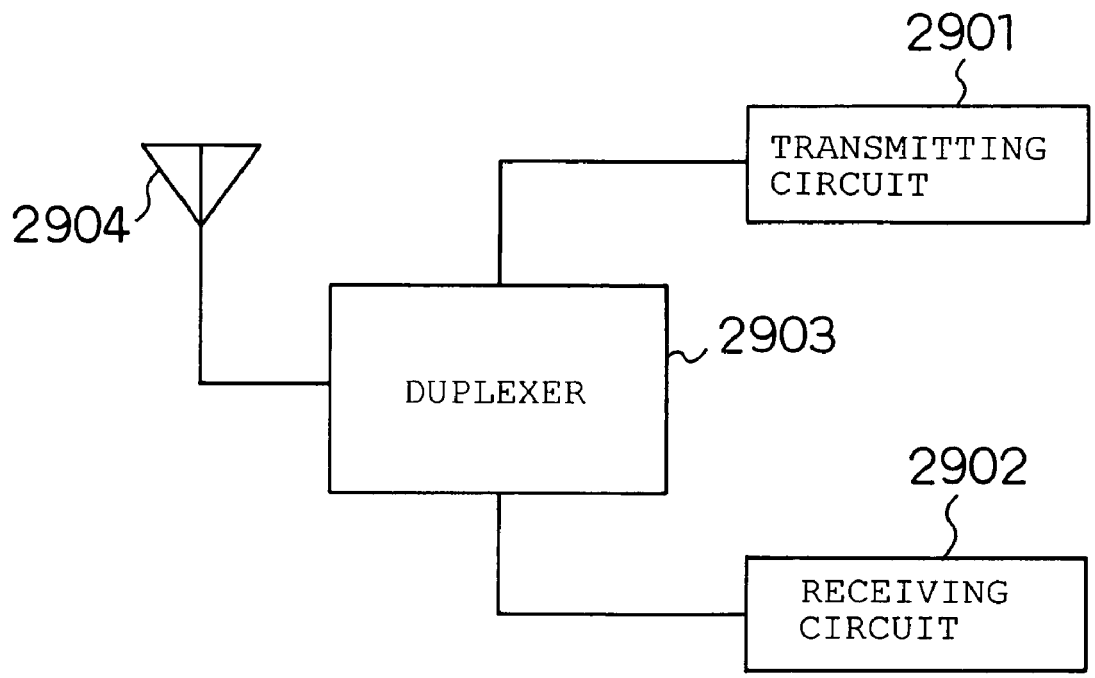
FIG. 24 is a block diagram showing a configuration example of communication equipment according to a fifth embodiment of the present invention.

In FIG. 24 is shown a configuration of a communication equipment of the fifth embodiment.

The communication equipment of FIG. 24 comprises a transmitting circuit 2901, a receiving circuit 2902, a duplexer 2903, and an antenna 2904.

The duplexer 2903 is connected to the transmitting circuit 2901, the receiving circuit 2902, and the antenna 2904.

The transmitting circuit 2901 is a circuit, which receives an inputted baseband signal from an unillustrated baseband unit, and outputs a transmitting signal. For the transmitting circuit 2901, the transmitting circuit described in each of the above described embodiments is used.

The receiving circuit 2902 is a circuit, which receives an inputted received signal, from the duplexer 2903, and outputs a baseband signal to the baseband unit. A duplexer using a dielectric, surface acoustic wave (SAW), and film bulk acoustic resonator (FBAR), or a semiconductor switch is used as the duplexer 2903.

The duplexer 2903 is means, which guides a transmitting signal outputted from the transmitting circuit 2901 to the antenna, and guides a received signal by the antenna 2904 to the receiving circuit 2902.

Next, the basic operation of the present embodiment will be described.

A baseband signal from an unillustrated baseband unit is inputted to the transmitting circuit 2901. In the transmitting circuit 2901, the same operation as described in each of the above described embodiments is performed, and the transmitting circuit 2901 outputs the transmitting signal to the duplexer 2903.

The duplexer 2903 guides a signal outputted from the transmitting circuit 2901 to the antennae 2904.

The antenna 2904 propagates a transmitting signal outputted from the duplexer 2903 in the air as a radio wave.

In the meantime, a received wave propagated from the air is converted into an electrical signal in the antenna 2904. The antenna 2904 outputs this signal as a received signal to the duplexer 2903.

The duplexer 2903 guides the received signal from the antenna 2904 to the receiving circuit 2902.

The receiving circuit 2902 performs detection and the like of the received signal guided from the duplexer 2903, and converts it into a baseband signal, and outputs it to the unillustrated baseband unit.

In this way, by using the transmitting circuit described in each of the above embodiments for the communication equipment of the fifth embodiment as the transmitting circuit 2901, a sufficient band width can be secured by the amplitude modulator, and the communication equipment having little distortion of the output signal can be provided.

Further, by using the transmitting circuit described in each of the above embodiments for the communication equipment of the fifth embodiment as the transmitting circuit 2901, the consumption power can be reduced, and the communication equipment which is highly efficient can be provided.

The transmitting circuit described in each of the above described embodiments can be used not only for the communication equipment, but also for audio equipment and video equipment.

Figure 25:
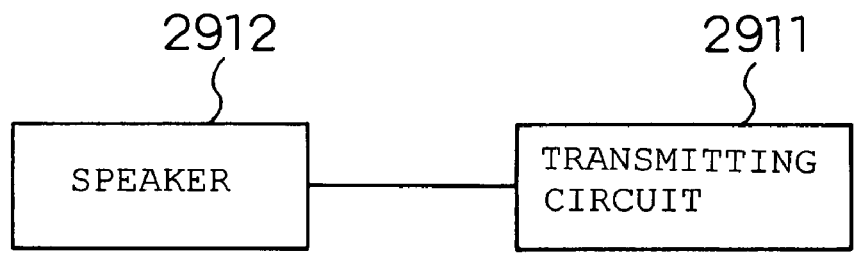
FIG. 25 is a block diagram showing a configuration example of audio equipment according to the fifth embodiment of the present invention.

In FIG. 25 is shown audio equipment.

The audio equipment shown in FIG. 25 comprises a transmitting circuit 2911 and a speaker 2912.

The speaker 2912 is an equipment, which converts an audio signal into a sound.

The transmitting circuit 2911 amplifies the inputted audio signal and outputs it. As the transmitting circuit 2911, the transmitting circuit of FIG. 8 or the transmitting circuit of FIG. 21 is used.

Next, the operation of the audio equipment of FIG. 25 will be described.

A sound signal such as music and the like recorded in CD and the like is reproduced by an unillustrated playback equipment. The sound signal reproduced by the unillustrated playback equipment is inputted to the transmitting circuit 2911.

The transmitting circuit 2911 amplifies the inputted sound signal, and outputs it to the speaker 2912.

The speaker 2912 converts the sound signal outputted from the transmitting circuit 2911 into a sound and outputs it.

Figure 26:
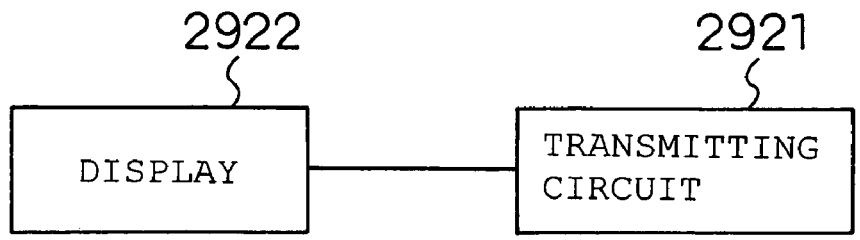
FIG. 26 is a block diagram showing a configuration of video equipment according to the fifth embodiment of the present invention.
Figure 27:
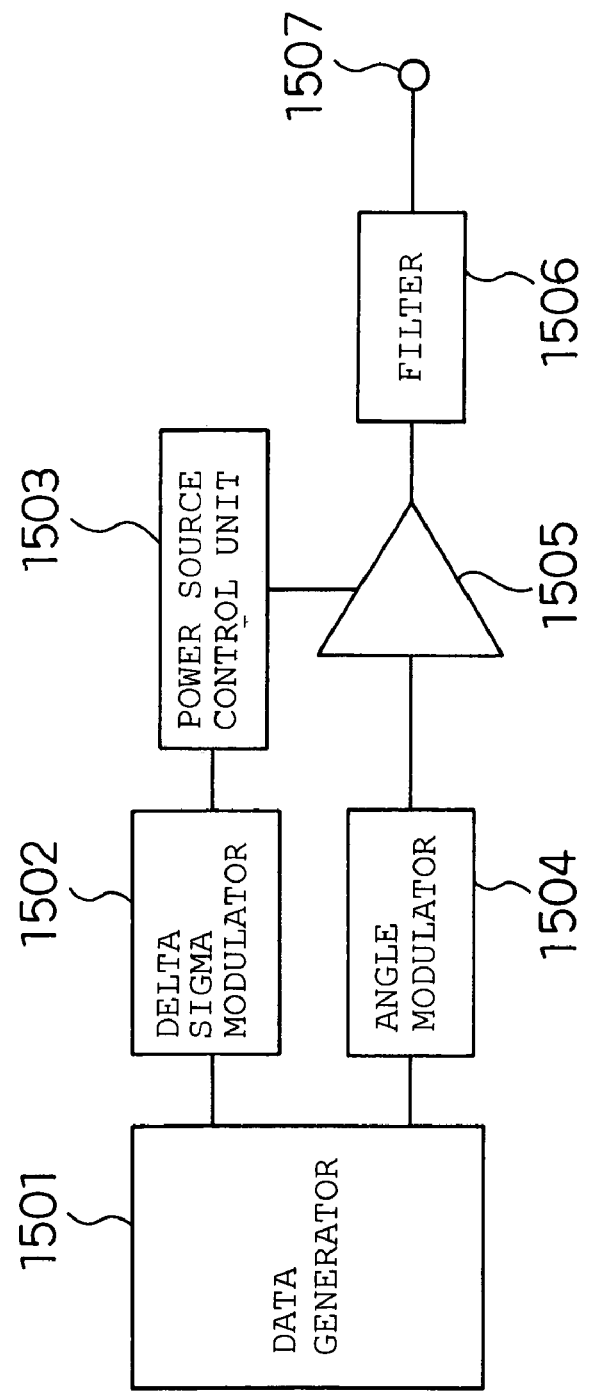
FIG. 27 is a block diagram showing a configuration example of a conventional transmitting circuit.

In FIG. 26 is shown video equipment.

The video equipment of FIG. 26 comprises a transmitting circuit 2921 and a display.

The display is equipment for displaying a video signal.

The transmitting circuit 2921 is a circuit, which receives the inputted video signal, and amplifies and outputs it. As the transmitting circuit 2921, the transmitting circuit of FIG. 8 or the transmitting circuit of FIG. 21 is used.

Next, the operation of the audio equipment of FIG. 26 will be described.

The video signal outputted from an unillustrated television receiver and the like is inputted to the transmitting circuit 2921.

The transmitting circuit 2921 amplifies the inputted video signal, and outputs it to a display 2922.

The display 2922 displays the video signal outputted from the transmitting circuit 2921.

In this way, by using the transmitting circuits of FIGS. 8 and 21, the consumption power can be reduced, and the audio equipment and the video equipment which are highly efficient can be provided.

The amplifying circuit of the present invention, similarly to the amplifying circuit 104, for example, shown in FIG. 1, is not limited to a circuit having a function only to amplify a signal to be inputted, but the amplifying circuit of the present invention, for example, similarly to the amplitude modulator 306 shown in FIG. 4, may be a circuit which amplifies a signal to be inputted, and at the same time, has a function to modulate a signal to be inputted. In brief, the amplifier circuit of the present invention may be a circuit serving as a function to modulate the inputted signal.

Further, the signal modulation conversion circuit of the present invention is not limited to the configurations described from the first and fourth embodiments. In brief, the signal modulation conversion circuit of the present invention may be any circuit which receives an inputted signal and modulates it in a predetermined system or signal-converts it in a predetermined system, and outputs a signal lower in resolution than the inputted signal.

The transmitting circuit, the communication equipment, the audio equipment, and the video equipment according to the present invention can secure a sufficient bandwidth, and have an effect of being small in distortion of the output signal, and are useful for the transmitting circuit, the communication equipment, the audio equipment, the video equipment, the transmitting method and the like used in a radio apparatus such as a mobile phone, a radio LAN, and the like.

Further, the transmitting circuit, the communication equipment, the audio equipment, and the video equipment according to the present invention can reduce the power consumption in the entire transmitting circuit, and have an effect of being highly efficient, and are useful for the transmitting circuit, the communication equipment, the audio equipment, the video equipment, the transmitting method and the like used in a radio apparatus such as a mobile phone, a WLAN, and the like.

What is claimed is:

1. A transmitting circuit, comprising;
    a signal modulation conversion circuit, which receives an inputted signal and performs a predetermined modulation or a predetermined signal conversion, and outputs a signal lower in resolution than said inputted signal;
    an amplifier of amplifying a signal outputted from said signal modulation conversion circuit;
    an isolation unit, one terminal of which is connected to the output of said amplifier; and
    a filter, which is connected to the other terminal of said isolation unit, and reduces an unnecessary frequency component of the signals outputted from said amplifier;
    wherein, in said isolation unit, magnitude of input reflection coefficient is smaller than magnitude of input reflection coefficient of said filter in a frequency band width from the frequency in which half the sampling frequency of said signal modulation conversion circuit is subtracted from the mean frequency of the signal outputted from said filter to the frequency in which half the sampling frequency of said signal modulation conversion circuit is added to the mean frequency of the signal outputted from said filter.

2. The transmitting circuit according to claim 1, further comprising an orthogonal data generator of generating an orthogonal data,
wherein said signal modulation conversion circuit comprises:
a vector data converter which is connected to the output of said orthogonal data generator of outputting a data smaller in resolution with respect to the magnitude expressed by a square root of the sum of squares of the orthogonal data; and
a modulator connected to the output of said vector data converter;
wherein said amplifier is connected to the output of said modulator.

3. The transmitting circuit according to claim 1, further comprising a polar data generator, which generates an amplitude data and a phase data, and outputs said amplitude data generated from a first output, and outputs said phase data generated from a second output,
wherein said signal modulation conversion circuit comprises:
a scalar data converter which is connected to the output of said first output of said polar data generator of outputting a data lower in resolution than an input;
a power source control unit connected to the output of said scalar data converter; and
an angle modulator connected to said second output of said polar data generator;
said amplifier serving as an amplitude modulator,
wherein said amplitude modulator is connected to the output of said angle modulator and the output of said power source control unit, and the output is connected to said isolation unit.

4. The transmitting circuit according to claim 1, further comprising a signal generator of generating a signal,
wherein said signal modulation conversion circuit has a scalar converter which is connected to the output of said signal generator of outputting a data lower in resolution than an input, and
wherein said amplifier is connected to the output of said scalar data converter.

5. The transmitting circuit according to any one of claims 1 to 4, wherein said isolation unit is an isolator.

6. The transmitting circuit according to any one of claims 1 to 4, wherein said isolation unit is an attenuator.

7. A transmitting circuit, comprising:
a signal modulation conversion circuit, which receives an inputted signal and performs a predetermined modulation or a predetermined signal conversion, and outputs a signal lower in resolution than said inputted signal;
an amplifier of amplifying a signal outputted from said signal modulation conversion circuit;
a power supply unit of supplying a power to said amplifier;
a circulator, which has a first terminal, a second terminal, and a third terminal, and outputs the signal inputted from said first terminal from said second terminal, and outputs the signal inputted from said second terminal from said third terminal, and outputs the signal inputted from said third terminal from said first terminal, and in which said first terminal is connected to the output of said amplifier;
a filter, which is connected to said second terminal of said circulator, and in which an unnecessary frequency component from among the signals outputted from said amplifier is attenuated; and
a power recycle unit, in which an input is connected to said third terminal of said circulator, and the output is connected to the output of said power supply unit, and an inputted signal is converted into a direct current signal and is outputted.

8. The transmitting circuit according to claim 7, further comprising an orthogonal data generator of generating an orthogonal data,
wherein said signal modulation conversion circuit comprises:
a vector data converter which is connected to the output of said orthogonal data generator of outputting a data smaller in resolution with respect to the magnitude expressed by a square root of the sum of squares of the orthogonal data; and
a modulator connected to the output of said vector data converter;
wherein said amplifier is connected to the output of said modulator.

9. The transmitting circuit according to claim 7, further comprising a polar data generator, which generates an amplitude data and a phase data, and outputs said amplitude data generated from a first output, and outputs said phase data generated from a second output,
wherein said signal modulation conversion circuit comprises:
a scalar data converter which is connected to the first output of said polar data generator of outputting a data lower in resolution than an input; and
an angle modulator connected to second output of said polar data generator,
wherein said power supply unit is a power source control unit connected the output of said scalar data converter,
wherein said amplifier serves as an amplitude modulator,
wherein said amplitude modulator is connected to the output of said angle modulator and the output of said power source control unit.

10. The transmitting circuit according to claim 7, further comprising a signal generator of generating a signal,
wherein said signal modulation conversion circuit has a scalar data converter which is connected to the output of said signal generator of outputting a data lower in resolution than an input,
wherein said amplifier is connected to the output of said scalar data converter.

11. The transmitting circuit according to claim 2 or 8, wherein said vector data converter comprises:
an original data generating unit of generating a in-phase signal I and quadrature-phase signal Q and an amplitude component of the orthogonal signal composed of said signal I and signal Q from the inputted signal;
a delta sigma modulator of converting said amplitude component into a signal having a resolution smaller than the resolution of said amplitude component;
a first multiplying unit of outputting a first data obtained by multiplying a normalized data I in which said signal I is divided by said amplitude component by said converted signal; and
a second multiplying unit of outputting a second data obtained by multiplying a normalized data Q in which said signal Q is divided by said amplitude component by said converted signal.

12. The transmitting circuit according to claim 2 or 8, wherein said vector data converter comprises:
- an orthogonal input terminal, to which the orthogonal data having an in-phase signal I and a quadrature-phase signal Q is inputted;
- an operation circuit connected to said orthogonal data input terminal;
- a vector quantizer connected to the output side of said operation circuit; and
- an output terminal connected to the output side of said vector quantizer;
- said signal I and said signal Q forming a predetermined vector,
- wherein said operation circuit is a circuit, in which a unit circuit comprising: a vector subtractor having a first input terminal and a second input terminal; and a vector integrator connected to the output side of said vector subtractor is connected in n (n is a natural number) pieces,
- wherein the output of said output terminal and/or the output of said each vector integrator is inputted to said second input terminal of the vector subtractor of said each unit circuit;
- wherein said orthogonal input terminal is connected to said first input terminal of a first vector subtractor of a first unit circuit;
- wherein each of said unit circuit is mutually connected by the output terminal of said vector integrator and said first input terminal of said vector subtractor;
- wherein said vector subtractor outputs an orthogonal data in which a vector made by the orthogonal data inputted to said second input terminal is subtracted from a vector made by orthogonal data inputted from said first input terminal;
- wherein said vector integrator integrates a vector composed of said inputted orthogonal data; and
- wherein said vector quantizer outputs a quantization predetermined value with respect to at least the magnitude of an inputted vector.

13. The transmitting circuit according to any one of claims 3, 4, 9 and 10, wherein said scalar data converter is a delta sigma modulation circuit.

14. The transmitting circuit according to any one of claims 8 to 10, wherein said power recycle unit comprises:
- a diode;
- a bias circuit of supplying a bias voltage to said diode; and
- a capacitor, which is connected in parallel to the output of said diode, and the other of which is grounded.

15. The transmitting circuit according to any one of claims 8 to 10, wherein said power recycle unit comprises:
- a balun;
- a pair of diodes connected to two outputs of said balun, respectively;
- a pair of bias circuits for supplying a bias voltage to said pair of diodes, respectively; and
- a pair of capacitors, which are connected in parallel to each output of said pair of diodes, and the other of which are grounded.

16. A communication equipment, comprising:
- a duplexer connected to an antenna;
- a transmitting circuit for outputting a transmitting signal to said duplexer; and
- a receiving circuit for receiving an inputted received signal from said duplexer;
- wherein, for said transmitting circuit, the transmitting circuit according to any one of claims 1 to 4, and 7 to 10 is used.

17. An audio equipment, comprising:
- a transmitting circuit of outputting an audio signal; and
- an audio output unit of outputting said audio signal outputted from said transmitting circuit as a sound;
- wherein, for said transmitting circuit, the transmitting circuit according to claim 4 or 10 is used.

18. A video equipment, comprising:
- a transmitting circuit of outputting a video signal; and
- a display unit of displaying said video signal outputted from said transmitting circuit;
- wherein, for said transmitting circuit, the transmitting circuit according to claim 4 or 10 is used.

19. A transmitting method, comprising the steps of:
- a signal modulation conversion step, which receives an inputted signal and performs a predetermined modulation or a predetermined signal conversion, and outputs a signal lower in resolution than said inputted signal;
- an amplifying step of amplifying a signal processed by said signal modulation conversion step;
- an isolation step of passing a signal processed by said amplifying step; and
- a filter step of reducing an unnecessary frequency component of the signals processed by said amplifying step;
- wherein in said isolation step, magnitude of input reflection coefficient is smaller than magnitude of input reflection coefficient of said filter step in a frequency band width from the frequency in which half the sampling frequency of said signal modulation conversion step is subtracted from the mean frequency of the signal processed by said filter step to the frequency in which half the sampling frequency of said signal modulation conversion step is added to the mean frequency of the signal processed by said filter step.

* * * * *